US012763250B2

(12) United States Patent
Pamulaparthy et al.

(10) Patent No.: US 12,763,250 B2
(45) Date of Patent: Oct. 13, 2026

(54) ENHANCED TRANSFORMER FAULT FORECASTING BASED ON DISSOLVED GASES CONCENTRATION AND THEIR RATE OF CHANGE

(71) Applicant: GE Infrastructure Technology LLC, Greenville, SC (US)

(72) Inventors: Balakrishna Pamulaparthy, Hyderabad (IN); Palak Jain, Hyderabad (IN); Hiteshkumar Mistry, Bengaluru (IN); Shivanand Bhavikatti, Bengaluru (IN); Abhishek Dey, Hyderabad (IN)

(73) Assignee: GE VERNOVA INFRASTRUCTURE TECHNOLOGY LLC, Greenville, SC (US)

( * ) Notice: Subject to any disclaimer, the term of this patent is extended or adjusted under 35 U.S.C. 154(b) by 298 days.

(21) Appl. No.: 18/736,593

(22) Filed: Jun. 7, 2024

(65) Prior Publication Data

US 2024/0412921 A1 Dec. 12, 2024

(30) Foreign Application Priority Data

Jun. 9, 2023 (IN) ............................ 202341039719

(51) Int. Cl.
*H01F 27/40* (2006.01)
*G01R 31/62* (2020.01)
(Continued)

(52) U.S. Cl.
CPC ........... *H01F 27/402* (2013.01); *G01R 31/62* (2020.01); *H02H 1/0092* (2013.01); *H02H 7/04* (2013.01); *H01F 2027/404* (2013.01)

(58) Field of Classification Search
CPC . H01F 27/402; H01F 2027/404; G01R 31/62; H02H 1/0092; H02H 7/04
(Continued)

(56) References Cited

U.S. PATENT DOCUMENTS 5,854,590 A 12/1998 Dalstein
6,307,376 B1 10/2001 Alexander et al.
(Continued)

FOREIGN PATENT DOCUMENTS

CN 104063577 A 9/2014
CN 111581596 A 8/2020
(Continued)

OTHER PUBLICATIONS

Zheng et al., A novel model based on wavelet LS-SVM integrated improved PSO algorithm for forecasting of dissolved gas contents in power transformers. Electric Power Systems Research, vol. 155, 2018, pp. 196-205, ISSN 0378-7796, Retrieved from the internet: URL: https://doi.org/10.1016/j.epsr.2017.10.010.
(Continued)

*Primary Examiner* — Robert R Raevis
(74) *Attorney, Agent, or Firm* — Eversheds Sutherland (US) LLP

(57) ABSTRACT

A method for using forecasting power transformer faults may include receiving dissolved gas data of power transformers; receiving features of the power transformers; generating, based on the features and the dissolved gas data, clusters of transformers, wherein each respective cluster of the clusters comprises transformers exhibiting similarities to each other; selecting, for each respective cluster and respective gas of the first dissolved gas data, from among machine learning models trained to minimize a difference between a forecast gas concentration and an actual gas concentration, a machine learning model; generating, using a selected machine learning model, a forecasted concentration of the respective gas of the respective cluster; estimating, using forecasted gas concentration, a ROC of the respective gas of the respective cluster; predicting, based on a comparison of the ROC to an ROC alarm threshold, a future fault of a
(Continued)

transformer; and generating an alert indicating the transformer maintenance is required.

20 Claims, 13 Drawing Sheets

(51) Int. Cl.
*H02H 1/00* (2006.01)
*H02H 7/04* (2006.01)

(58) Field of Classification Search
USPC ...... 73/1.01–1.2, 19.01, 31.05, 31.06, 865.8, 73/865.9, 866; 702/22, 24, 33–35, 57, 702/58, 64, 65, 81, 82, 85, 104, 127, 702/180–184; 324/547; 706/1–13; 703/6–22
See application file for complete search history.

(56) References Cited

U.S. PATENT DOCUMENTS

| | | | |
|---|---|---|---|
| 6,721,671 | B2 | 4/2004 | Roberts |
| 7,502,696 | B2 | 3/2009 | Moxley |
| 7,812,615 | B2 | 10/2010 | Gajic et al. |
| 7,864,492 | B2 | 1/2011 | Restrepo et al. |
| 7,949,497 | B2 | 5/2011 | Yuan et al. |
| 8,868,985 | B2 | 10/2014 | Hackstein et al. |
| 8,886,574 | B2 | 11/2014 | Yuan et al. |
| 9,160,158 | B2 | 10/2015 | Schweitzer, III et al. |
| 9,322,866 | B2 | 4/2016 | Abeywickrama et al. |
| 9,665,843 | B2 | 5/2017 | Smiley et al. |
| 10,001,518 | B2 | 6/2018 | Cheim et al. |
| 10,281,338 | B2 | 5/2019 | Feng et al. |
| 10,288,043 | B2 | 5/2019 | Yu et al. |
| 10,599,137 | B2 | 3/2020 | Dai et al. |
| 10,644,493 | B2 | 5/2020 | Gubba Ravikumar et al. |
| 10,651,645 | B2 | 5/2020 | Cui et al. |
| 11,112,466 | B2 | 9/2021 | Schweitzer, III et al. |
| 11,300,603 | B2 | 4/2022 | Ruan et al. |
| 11,391,775 | B2 | 7/2022 | Ikaheimo |
| 11,448,701 | B2 | 9/2022 | Hujband et al. |
| 11,467,214 | B2 | 10/2022 | Gugaliya et al. |
| 11,474,139 | B2 | 10/2022 | Hao |
| 11,513,155 | B2 | 11/2022 | Rodriguez et al. |
| 11,520,316 | B2 | 12/2022 | Kuikka et al. |
| 11,531,066 | B2 | 12/2022 | Bianco et al. |
| 11,544,134 | B2 | 1/2023 | Khorasgani et al. |
| 11,550,000 | B2 | 1/2023 | Bayoumi et al. |
| 11,694,320 | B2 | 7/2023 | Gitzel et al. |
| 2018/0189662 | A1 | 7/2018 | Nasle |
| 2021/0075209 | A1 | 3/2021 | Wahlroos et al. |

FOREIGN PATENT DOCUMENTS

| | | | | | |
|---|---|---|---|---|---|
| CN | 112329335 | A | | 2/2021 | |
| CN | 112734028 | A | | 4/2021 | |
| CN | 114595883 | A | | 6/2022 | |
| CN | 116756508 | A | * | 9/2023 | ............. G06F 18/20 |
| CN | 117805688 | A | * | 4/2024 | ............. G01R 31/62 |
| EP | 2427862 | B1 | | 7/2016 | |
| EP | 3743332 | B1 | | 11/2022 | |

OTHER PUBLICATIONS

Liu et al., Combined Forecasting Method of Dissolved Gases Concentration and Its Application in Condition-Based Maintenance. in IEEE Transactions on Power Delivery, vol. 34, No. 4, pp. 1269-1279, Aug. 2019, doi: 10.1109/TPWRD.2018.2881747.

Mulliez et al., ‘Life characterization of power distribution transformers using clustering techniques’, Comillas Pontifical University, Engineering School, Institute for Research in Technology, PHM Society European Conference, 2018, 8 pages, Madrid, Spain.

Bustamante et al., Case Study—Calculation of DGA Limit Values and Sampling Interval in Power Transformers. 2019 6th International Advanced Research Workshop on Transformers (ARWtr), Cordoba, Spain, 2019, pp. 64-68, doi: 10.23919/ARWtr.2019.8930184.

* cited by examiner

502

702

ENHANCED TRANSFORMER FAULT FORECASTING BASED ON DISSOLVED GASES CONCENTRATION AND THEIR RATE OF CHANGE

CROSS-REFERENCE TO RELATED APPLICATION(S)

This application claims the priority benefit of Indian application No. 202341039719, filed Jun. 9, 2023, which is incorporated herein, in its entirety, by reference.

TECHNICAL FIELD

This disclosure generally relates to forecasting transformer fault based on dissolved gases concentration and their rate of change in a transformer.

BACKGROUND

Transformer oil dissolved gas analysis is a useful, predictive, and effective way for evaluating transformer health. The breakdown of electrical insulating material and related components inside a transformer may generate gases that may be indicative of transformer faults, so detecting the gases generated may allow for transformer maintenance.

SUMMARY

A method for using forecasting power transformer faults may include: receiving, by at least one processor of a device, dissolved gas data of power transformers; receiving, by the at least one processor, features of the power transformers; generating, by the at least one processor, based on the features and the dissolved gas data, clusters of transformers, wherein each respective cluster of the clusters comprises transformers exhibiting similarities to each other; selecting, by the at least one processor, for each respective cluster and for each respective gas of the dissolved gas data, from among multiple machine learning models trained to minimize a difference between a forecast gas concentration and an actual gas concentration, a machine learning model associated with forecasting concentration of the respective gas of the respective cluster; generating, by the at least one processor, using a selected machine learning model, a forecasted concentration of the respective gas of the respective cluster; estimating, by the at least one processor, using forecasted gas concentration, a ROC of the respective gas of the respective cluster; predicting, by the at least one processor, based on a comparison of the forecasted gases and their ROC to their alarm threshold, a future fault of a transformer; and generating, by the at least one processor, an alert indicating the transformer maintenance is required enabling proactive maintenance.

A device for using forecasting power transformer faults, the device comprising memory coupled to at least one processor that may: receive dissolved gas data of power transformers; receive features of the power transformers; generate, based on the features and the dissolved gas data, clusters of transformers, wherein each respective cluster of the clusters comprises transformers exhibiting similarities to each other; select, for each respective cluster and for each respective gas of the dissolved gas data, from among multiple machine learning models trained to minimize a difference between a forecast gas concentration and an actual gas concentration, a machine learning model associated with forecasting concentration of the respective gas of the respective cluster; generate, using a selected machine learning model, a forecasted gas concentration of the respective gas of the respective cluster; estimate, using forecasted gas concentration, a ROC of the respective gas of the respective cluster; predict, based on a comparison of the forecasted gases and their ROC to their alarm threshold, a future fault of a transformer; and generate an alert indicating the transformer maintenance is required enabling proactive maintenance A system for using forecasting power transformer faults may include: a dissolved gas analyzer device; and memory coupled to at least one processor, the at least one processor may: receive, from the dissolved gas analyzer device, dissolved gas data of power transformers; receive features of the power transformers; generate, based on the features and the dissolved gas data, clusters of transformers, wherein each respective cluster of the clusters comprises transformers exhibiting similarities to each other; select, for each respective cluster and for each respective gas of the dissolved gas data, from among multiple machine learning models trained to minimize a difference between a forecast gas concentration and an actual gas concentration, a machine learning model associated with forecasting concentration of the respective gas of the respective cluster; generate, using a selected machine learning model, a forecasted gas concentration of the respective gas of the respective cluster; estimate, using forecasted gas concentration, a ROC of the respective gas of the respective cluster; predict, based on a comparison of the forecasted gases and their ROC to their alarm threshold, a future fault of a transformer; and generate an alert indicating the transformer maintenance is required enabling proactive maintenance

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

Figure 1:
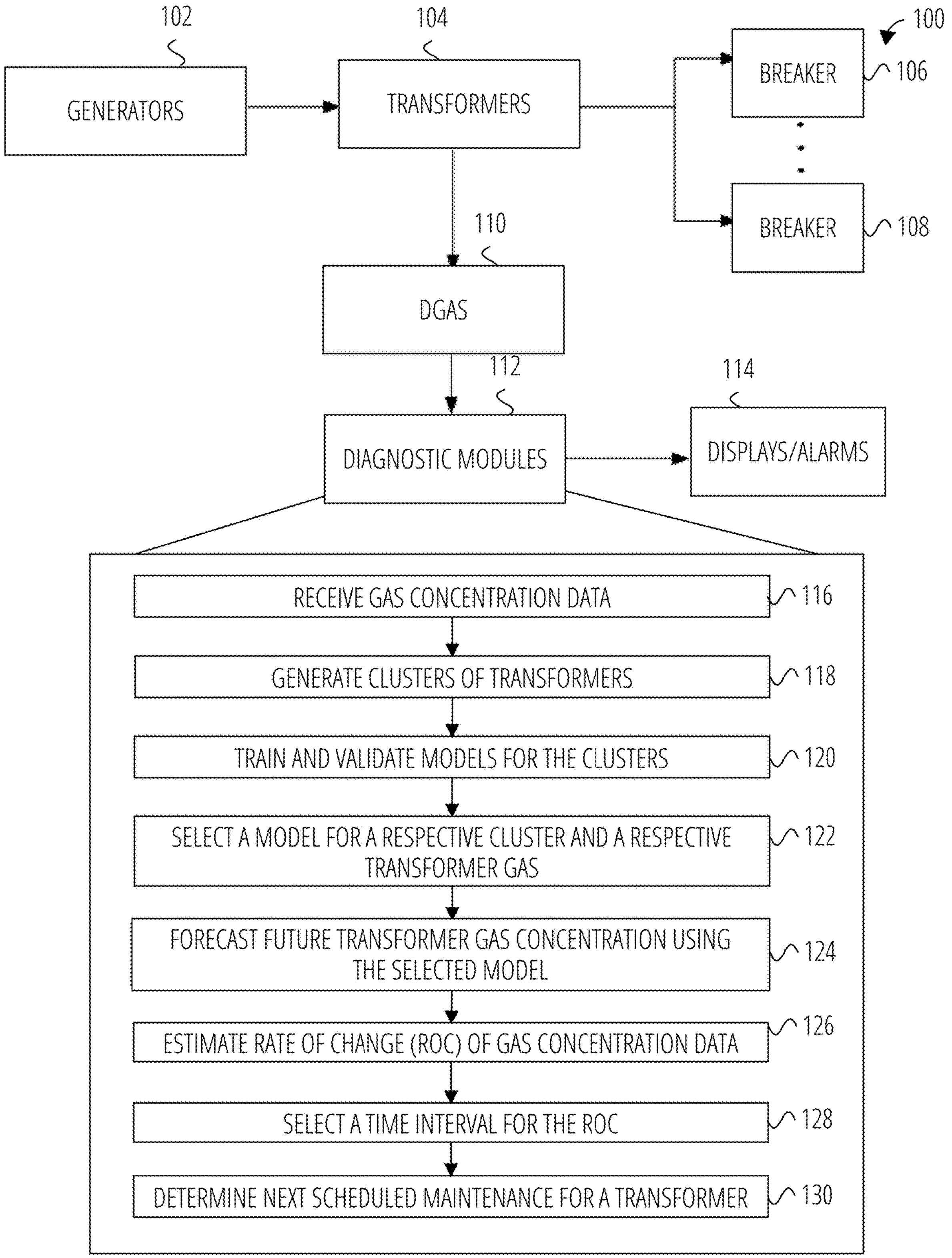
FIG. 1 illustrates an example transformer system using transformer fault forecasting based on dissolved gases concentration and their rate of change in accordance with one embodiment of the present disclosure.

Certain implementations will now be described more fully below with reference to the accompanying drawings, in which various implementations and/or aspects are shown. However, various aspects may be implemented in many different forms and should not be construed as limited to the implementations set forth herein; rather, these implementations are provided so that this disclosure will be thorough and complete, and will fully convey the scope of the disclosure to those skilled in the art. Like numbers in the figures refer to like elements throughout. Hence, if a feature is used across several drawings, the number used to identify the feature in the drawing where the feature first appeared will be used in later drawings.

DETAILED DESCRIPTION

Power transformer requires various maintenance tasks that include preventive maintenance and breakdown maintenance. Dissolved Gas Analysis (DGA) is useful in detecting and predicting transformer faults determining the maintenance on ad-hoc basis that is as required. However, DGA may generate false positive alarms that incorrectly indicate a transformer fault based on the presence of gases in transformers. Alarm thresholds used to detect transformer fault based on gas levels often are set manually based on established standards. For example, the IEEE and IEC standards organizations have set fixed alarm thresholds for gas concentration and their rate of change (ROC), such as IEEE-C57.104-2019. For example, the IEEE-C57.104-2019 standard recommends static alarm thresholds that are generic based on its own transformer network or fleet historical data instead of those that are specific to a transformer. The IEC 60599-1999 standard provides the following alarm thresholds for transformer gas ROC, as shown in Table 1.

TABLE 1

IEC 60599-1999 Static Alarm Thresholds for rate of change in gas concentration:

| Gas | Values in milliliters/day |
|---|---|
| Hydrogen | <5 |
| Methane | <2 |
| Ethane | <2 |
| Ethylene | <2 |
| Acetylene | <0.1 |
| Carbon monoxide | <50 |
| Carbon dioxide | <200 |

However, the static alarm thresholds may result in false positives and may not be robust for grids with penetration of distributed energy resources, decarbonization, different types of loads being added, different loading characteristics of transformers, and different transformer manufacturing. Fixed alarm thresholds used in the standards may be transformer-agnostic and based on the 90th/95th percentile of thousands of same types of transformers connected in a network. As a transformer ages or experiences significant or frequent load changes, the generated gas concentrations tend to rise naturally. A possible result is a false fault alarm based on the fixed alarm thresholds resulting in transformer forced shutdown for maintenance and repair To avoid fault conditions and transformer breakdown, proactive maintenance may be performed based on forecasting the dissolve gases concentrations and their rate of change. Proactive maintenance may provide duration for which transformers may operate reliably and indicates the time for their servicing or replacement.

Transformer gas concentration may depend on a variety of factors such as seasonality (e.g., environmental factors such as temperature, humidity, etc.), historical operation and maintenance of the transformer, degradation severity, operational variations, and the like. Such factors should be accounted for to ensure accurate transformer condition estimation and fault prognosis, likely requiring extensive historical and repetitive gas concentration data. There are approaches that may include exponential smoothing with a seasonal effect, autoregressive integrated moving average (ARIMA), seasonal ARIMA (SARIMA), and the like to forecast time-dependent features such as gas concentrations. Additionally, machine learning models like Prophet and DeepAR may also be used to forecast the dissolved gases concentrations. ROC of dissolved gases concentration may not be measured directly and may be calculated by using linear approximation or any other technique. It may vary significantly based on the number of gas concentration samples in a time window (i.e. chosen to compute ROC) and may have no seasonality for any time window duration, so forecasting ROC directly is not possible. However, absolute gas concentration shows seasonality, so forecasting absolute gas concentrations and estimating gas concentration ROC from the forecasted gas concentrations may provide an accurate fault prediction.

Time-series forecasting may include time-series components such as trend, cyclical, irregular, and seasonal (SARIMA). ARIMA may be represented by (p, d, q) $(P, D, Q)_m$ where (p, d, q) is the non-seasonal portion of the model, and $(P, D, Q)_m$ is the seasonal portion of the model, m is the number of periods per season, p, d, q are non-negative integers, P is autoregression, d is integrated (e.g., differencing of observations), and 4 is a moving average. Error metrics for evaluating a mode may include mean absolute error, mean square error, and root-mean-square error (RMSE), where $$RMSE = \sqrt{\frac{1}{n}\sum\left(y_i \,{}_{i=1}^{n}\, y\hat{}_i\right)^2}$$

where y is the real value of the test data, and y' is the predicted value from the forecast. Other Time-series forecasting approaches may comprise of Prophet model, which is a statistical model capable of modelling trends and different seasonality components and DeepAR model which is based on recurrent networks.

In one or more embodiments, the enhanced techniques herein consider other approaches to forecast (e.g., predict) future gas concentrations in transformers by identifying trends in gas concentrations and comparing the forecasted gas values to transformer alarm thresholds. Machine learning models such as Prophet and DeepAR may be trained and tested to forecast the gas concentrations. Linear approximation may estimate gas concentration ROC. The proposed methodology herein forecasts the dissolved gas concentrations and their gradient (i.e. ROC) and predicts fault by comparing them with thresholds values from standards and/or adaptive thresholds. The enhancements herein enable proactive maintenance of transformers and reliable grid operation, may provide a duration for which transformers can operate reliably, and may indicate a time for transformer servicing or replacement.

As a result of the enhanced techniques herein, fault protection may be improved, which may optimize scheduled transformer maintenance and may extend the life of the transformer. In addition, maintenance may be reduced and grid reliability may be increased.

In one or more embodiments, a respective transformer gas may use a best model selected from among multiple models that may forecast gas concentration. The performance of the models may be assessed across one or more transformers, and the best model for the gas may be selected for use in forecasting the gas concentration. A system may pre-process historical gas concentration data from transformers (e.g., by removing singular values, transforming unequal interval series to equal interval series by linear interpolation, normalizing the data). The system may cluster transformers by identifying groups of transformers exhibiting similar behavior to test the machine learning models. The transformer clustering may be based on transformer features such as operation, oil condition, transformer state, and dissolved gas concentration history. The system also may match a newly added transformer (e.g., newly added to a grid) to an already-identified cluster. Transformer clustering also may be based on a transformer configuration (e.g., nameplate information), a daily load profile, and oil temperature.

In one or more embodiments, for the respective transformer clusters, the system may train and test the machine learning models for respective gases, and may evaluate the models for their performance in forecasting gas concentration. The model that is the most accurate at forecasting for a given gas may be selected for the cluster. The machine learning models may include statistical algorithms and deep learning models, with the different models exhibiting different strengths. For example, the models may include persistence models and time-series models. The machine learning models may include statistical models like Prophet, capable of modeling trends and seasonality components, autoregressive deep learning models, recurrent networks like DeepAR for time-series forecasting, and ARIMA (e.g., for an initial assessment).

In one or more embodiments, the transformer clustering may be based on principal components analysis (PCA) of the transformers plus k-means clustering. For example, based on a selection of principal components, transformer PCAs may exhibit a cumulative sum of variance ratio, which may be used to identify similar transformers to be included in a given cluster. For nine transformer gases, for example, a PCA may be applied to reduce the dimensions from nine to three (the dimension reduction size is not limited, as this is an example). The transformer clusters may be generated within the three-dimensional space from the PCA dimension reduction to cluster similar transformers. The number of clusters may vary, so the clustering may result in an optimal number of clusters based on the transformer similarities.

In one or more embodiments, to select the best model for a cluster for a respective gas, the system may evaluate the number of times a model has the best performance (e.g., lowest root-mean-square deviation RMSE) across the transformers in the cluster. The best performance analysis may be based on a comparison of a model's forecast to actual gas concentration data for the same time period (e.g., lower RMSE for a model indicates stronger performance). A model may generate a forecast for the gas concentration, which the system may use to forecast the ROC of the gas concentration. To estimate ROC, a time interval is selected based on statistics and heuristics. The time interval may be a sliding time window that could be fixed or variable. The system may determine an optimal next scheduled maintenance time for a transformer using the forecasted gas concentration and their ROC estimation over the time interval. Moreover, the system may estimate the optimal window size using an auto-feedback mechanism for any gas and cluster type to fine-tune the estimated ROC accuracy. Both forecasted gas parts per million (PPM) and their ROC may be compared with their alarm thresholds (that could be static or adaptive), respectively, to accurately forecast and monitor transformer condition in the future. The forecasting of critical transformer parameters (i.e. gas concentration and their ROCs) and their comparison with alarm threshold enables determination of accurate time available for maintenance/time to possible fault occurrence/time to over-heating condition/time to replace. The system may use the feature forecast from the selected model to forecast if and when a future fault (e.g., transformer fault related to high gas concentration) may occur.

Forecasting gas ROC data may be affected by ROC time window duration and the minimum number of samples. The sample interval may determine the ROC time window duration. The lower the ROC time window, the more false alarms there may be. The ROC time window therefore may be set to at least 48 hours for less ROC volatility. For a sample interval greater than one day, the ROC forecast may be in ppm/month or ppm/week (e.g., to account for multiple days/samples). The sample interval may be selected to provide at least 48 samples (n in the ROC formula), so the ROC time window may depend on the sample interval.

In one or more embodiments, the gas concentration forecasting may use a direct approach or a recursive approach. In the direct approach, the predicted gas concentration may not be dependent on a previous prediction. In the recursive approach, the predicted gas concentration for a time interval may depend on a prediction for another time interval.

In one or more embodiments, the transformer fault alarms may use adaptive alarm thresholds for ROC of gas for transformers in operation. The present disclosure provides multiple new techniques for setting and using adaptive thresholds and for determining a gas concentration ROC. A dissolved gas analyzer may provide a gas concentration in parts-per-million (ppm), and from the gas concentration, the gradient (ROC) may be calculated. Adaptive alarm thresholds may be used for both the gas concentration and the ROC. The gas concentrations from DGA may be compared to static or adaptive alarm thresholds, and when the gas concentration exceeds a threshold, a probable fault condition may be hypothesized. To confirm the fault condition, the ROCs may be compared to the adaptive alarm thresholds to minimize false alarms. In this manner, the fault detection and confirmation may be based on comparing both gas concentration and ROC of gas concentration to alarm thresholds, with at least the ROC alarm thresholds being adaptive.

The benefits of the enhanced techniques of the present disclosure include proactive maintenance by predicting next optimal maintenance schedule, determination of accurate time available for maintenance/time to possible fault occurrence/time to over-heating condition/time to replace, improved anomaly detection, reducing the need to set alarm thresholds manually for transformers, and reducing computational expense (e.g., allowing for the techniques to be applied on a variety of devices). In contrast with some techniques that use an established alarm threshold (e.g., 95th percentile), the enhanced adaptive alarm thresholds herein may use prior knowledge from the fixed thresholds of the standards to determine the adaptive thresholds more adaptively. For reference, a fixed-size window $t_w$ may slide over a device data frame and its 95th percentile generates a threshold $\tau$ that may vary as the window slides: $\tau=f(\beta, t_w)$ 95th percentile of $\beta_{t_w}$, where $\tau$ is an adaptive threshold for alarms. Even the adaptive thresholds are less than those from the standard and may result in higher false positives because the data used by the standards includes a variety of transformer health conditions, such as fault-free, incipient fault, sever fault, and breakdown, whereas the data used in the enhanced techniques herein has no fault condition.

In one or more embodiments, a DG analyzer may sample gases in a transformer at any sampling rate (e.g., the enhanced techniques are agnostic to sampling rate). The DG analyzer may determine gas concentrations of respective gases and their ROCs. The ROC calculation may use Equation (1): $p=\beta t+\alpha$, where p is the concentration (ppm) of a gas target measurement, $\beta$ is the ROC formula, t is the time from initial zero start time, and $\alpha$ is a vertical axis intercept. After determining the ROC for a gas, the DG analyzer may apply one of the data-driven techniques disclosed herein to generate ROC-adaptive alarm thresholds. The DG analyzer may apply the ROC-adaptive alarm thresholds and the standard-based thresholds to the data stream of gas data to determine whether a subsequent ROC exceeds a ROC-adaptive alarm threshold.

In one or more embodiments, the DG analyzer may use ROC limits from the standard, that is prior knowledge of thresholds and may add them to an adaptive threshold. Using the example of Table 1 above, the standard-based Hydrogen alarm threshold is 5 mm/day. Alternatively, the DG analyzer may operate with no prior knowledge of thresholds from the standard to an adaptive threshold (e.g., ignore the 5 mm/day threshold for Hydrogen). With no prior knowledge of thresholds from the standard, the DG analyzer may generate an adaptive threshold for a gas ROC. The DG analyzer may use some previous ROC values for a gas using a static or variable sliding time window of ROC values (e.g., use the last n ROC values, or use a variable window of ROC values at each sampling rate). The variable time window reduces ROC computations unlike the case of fixed time window where a new ROC value is calculated at every sampling rate, The DG analyzer may increase or reduce the sliding time window size (i.e., the number of ROC values) when the DG analyzer detects no change or a change in gas concentration respectively. When the window of ROC samples is variable or fixed, the DG analyzer may use the L2 norm (or another norm) of the ROC or difference of two consecutive sorted ROCs referred to as Delta ROC, mu+α*SD, where mu is the mean and SD is standard deviation of the ROC or the Delta ROC, and α is the multiplication factor with a default value of 2, or mu_w+SD_w with a weighted mu and weighted standard deviation. Some of the methodologies with a fixed window of ROC samples are shown below in Table 2.

TABLE 2

Fixed ROC Window (n is fixed) based Adaptive Alarm Thresholds:

| Method | Parameter | Threshold With No Prior Knowledge of Thresholds from the Standard |
|---|---|---|
| Mean and Standard Deviation | ROC | $\tau_{t_w} = \mu_\beta + 2\times\vartheta_\beta$ |
| Weighted Mean and Weighted Standard Deviation | ROC | $\tau_{t_w} = \mu_{\omega\beta} + 2\times\vartheta_{\omega\beta}$ |
| | | $\mu_{\omega\beta} = \frac{\sum_{i=1}^{n}\omega_i\beta_{t_w}(\mathrm{i})}{\sum_{i=1}^{n}\omega_i}$ |
| | | $\omega_i = 1 - \frac{\lvert\mu_\beta - \beta_{t_w(i)}\rvert}{\max\lvert\mu_\beta - \beta_{t_w}\rvert}$ |
| | | $\vartheta_{\omega\beta} = \left[\frac{\sum_{i=1}^{n}\omega_i}{\left(\sum_{i=1}^{n}\omega_i\right)^2 - \sum_{i=1}^{n}\omega_i^2}\sum_{i=1}^{n}(\mu_{\omega\beta} - \beta_{t_w}(\mathrm{i}))^2\right]^{0.5}$ |
| L2 Norm | ROC | $\tau_{t_w} = \sqrt{\sum_{i=1}^{n}\lvert\beta_{t_w}(\mathrm{i})\rvert^2}$ |
| Mean and Standard Deviation | Delta ROC | $\tau_{t_w} = \mu_{\Delta\mu} + 2\times_{\Delta\beta}$ |
| Weighted Mean and Standard Deviation | Delta ROC | $\tau_{t_w} = \mu_{\omega\Delta\beta} + \vartheta_{\omega\Delta\beta}$ |
| | | $\mu_{\omega\Delta\beta} = \frac{\sum_{i=1}^{n}\omega_i\Delta\beta_{t_w}(\mathrm{i})}{\sum_{i=1}^{n}\omega_i}$ |
| | | $\omega_i = 1 - \frac{\lvert\mu_{\Delta\beta} - \Delta\beta_{t_w(i)}\rvert}{\max\lvert\mu_{\Delta\beta} - \Delta\beta_{t_w}\rvert}$ |

TABLE 2-continued

| Method | Parameter | Threshold With No Prior Knowledge of Thresholds from the Standard |
|---|---|---|
| Fixed ROC Window (n is fixed) based Adaptive Alarm Thresholds: | | |
| | | $\vartheta_{\omega\Delta\beta} = \left[\frac{\sum_{i=1}^{n}\omega_i}{\left(\sum_{i=1}^{n}\omega_i\right)^2 - \sum_{i=1}^{n}\omega_i^2}\sum_{i=1}^{n}\left(\mu_{\omega\Delta\beta} - \beta_{t_w}(\mathrm{i})\right)^2\right]^{0.5}$ |
| L2 Norm | Delta ROC | $\tau_{t_w} = \sqrt{\sum_{i=1}^{n}\left\|\Delta\beta_{t_w}(\mathrm{i})\right\|^2}$ |

One approach shown in Table 2 is to ignore the prior knowledge from the standard and directly apply the estimated thresholds to detect fault. However, this may not help in achieving robustness and may still result in false alarms. Therefore, another approach includes the prior knowledge in adaptive threshold estimation. The threshold values from the standard may be added to the estimated thresholds. With prior knowledge of thresholds from the standard, the threshold may be set according to: $\tau=\tau_{t_w}+\tau_{standard}$ where $\tau_{l_w}=\{\tau_{l_w}(1), \Sigma_{l_w}(2), \ldots, \Sigma_{l_w}(n)\}$. $\tau_{standard}$ may represent the prior knowledge (e.g., the threshold from the standard),) where n is the number of samples in a sliding time window tw that could be variable or fixed.

The statistical methods in Table 2 may be applied on ROC, beta and Delta ROC, and deltabeta time series whose length is determined by $t_w$ that could be fixed or variable. The delta ROC may be calculated by taking the difference between two consecutive sorted ROC either in ascending or descending order as shown in the equations: $\beta_{t_w}=\{\beta_{t_w}(1), \beta_{t_w}(2), \ldots, \beta_{t_w}(n)\}$, $\Delta\beta_{t_w}=\{\Delta\beta_{t_w}(1), \Delta\beta_{t_w}(2), \ldots, \Delta\beta_{t_w}(n)\}$, where $\Delta\beta_{t_w}(i)=\beta_{t_w}(i)-\Delta\beta_{t_w}(i-1)\forall i=1, 2, \ldots n$ and where $\Delta\beta_{t_w}(1)=0$, $\Delta\beta_{t_w}(2)=\Delta\beta_{t_w}(2)-\Delta\beta_{t_w}(1), \ldots, \Delta\beta_{t_w}(n)-\Delta\beta_{t_w}(n)-\Delta\beta_{t_w}(n-1)$.

The enhanced adaptive alarms herein add a methodology for computing gas concentration gradient by selecting a time window (e.g., n=1-96 hours), computing adaptive thresholds for gas concentration gradient using one of the adaptive methods above, some of which may use prior knowledge of standards-based thresholds, and improve the fidelity of fault detection for transformers based on gas concentration and their gradients.

The above descriptions are for purposes of illustration and are not meant to be limiting. Numerous other examples, configurations, processes, etc., may exist, some of which are described in greater detail below. Example embodiments will now be described with reference to the accompanying figures.

FIG. 1 illustrates an example transformer system 100 using transformer fault forecasting based on r gas concentrations and their rate of change in accordance with one embodiment of the present disclosure.

Referring to FIG. 1, the system 100 may include a generators 102 for generating and providing power to a transformers 104. The current provided by the transformers 104 may be used to operate breakers (e.g., breaker 106, breaker 108). A DGAs 110 device may be coupled to the transformers 104 using an interface (e.g., one or more gas lines) to monitor and analyze any gas buildup inside of the transformers 104. When gas is present in the transformers 104, the DGAs 110 device may sample transformer oil periodically and execute one or more dissolved gases analysis procedures and provide DGA data to an intelligent electronic device that hosts the diagnostic modules 112. The diagnostic modules 112 may detect when DGA gas levels in the transformers 104 exceed one or more adaptive thresholds, which may be fixed (e.g., static alarm thresholds from IEEE or IEC standards) or variable (e.g., adaptive threshold generated from current and historical DGA data). When the DGA gas levels exceed or are forecasted to exceed an adaptive threshold, the diagnostic modules 112 may communicate the high DGA gas levels to a displays/alarms 114 to alert a user of the gas levels and/or times when to maintenance the transformers 104, and/or may control the transformers 104 and/or breakers to prevent unsuitable operation with the high gas levels in the transformers 104.

Still referring to FIG. 1, the DGAs 110 device and/or the diagnostic modules 112 may forecast faults and determine when to maintenance the transformers 104 according to a process. For example, at block 116, the diagnostic modules 112 may receive gas concentration data from the DGAs 110. At block 118, the diagnostic modules 112 may generate clusters of the transformers 104 based on their similarities. At block 120, the diagnostic modules 112 may train and validate multiple models for the clusters, and any gas analyzed may have a separate model for its forecasting. At block 122, based on the performance of the models, the diagnostic modules 112 may select a respective model, from among the models available for a given gas, for a cluster. In this manner, any cluster may have a separate model selected for any gas analyzed for the cluster. At block 124, the 112 may forecast future transformer gas concentration using the selected model. Adaptive. At block 126, the diagnostic modules 112 may estimate ROC of the gas concentration data, and at block 128, may select a time interval for the ROC. Using the selected time window with which to determine the ROC, the diagnostic modules 112 may, at block 130, determine a next scheduled maintenance time for a transformer.

Figure 2:
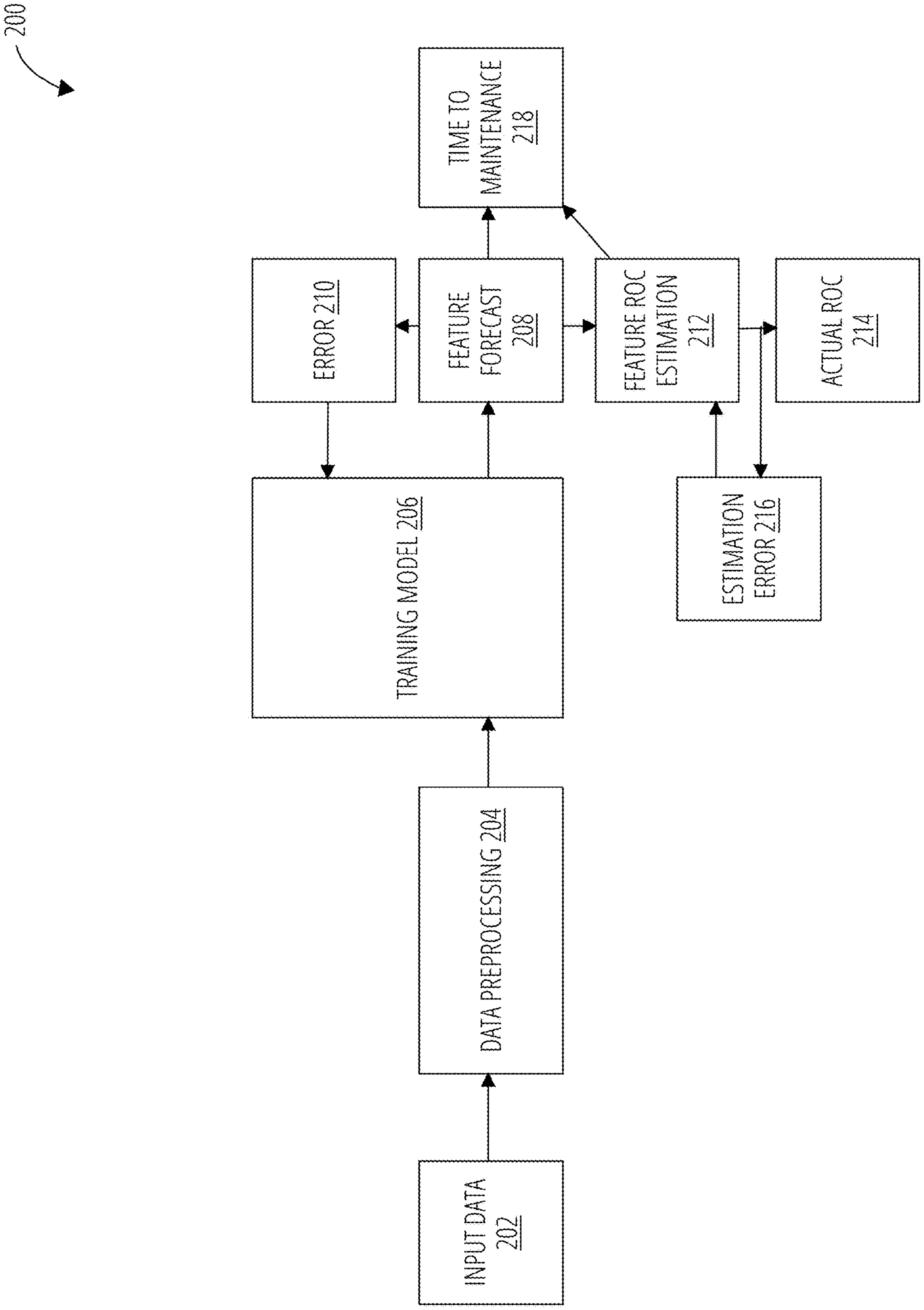
FIG. 2 illustrates an example transformer process using transformer fault forecasting based on dissolved gases concentration and their rate of change in accordance with one embodiment of the present disclosure.

FIG. 2 illustrates an example transformer process 200 using transformer fault forecasting based on dissolved gases concentration and their rate of change in accordance with one embodiment of the present disclosure.

Referring to FIG. 2, the process 200 may include input data 202 being pre-processed at a data preprocessing 204 step. The input data 202 may include raw transformer gas data (e.g., historical gas concentration data from one or more transformers) along with a feature selection and/or user inputs. The data preprocessing 204 may include removing singular values from the input data 202, transforming unequal interval series of the input data 202 to equal interval series (e.g., using linear interpolation), and normalizing the input data 202. The pre-processed input data 202 may be input to a training model 206, which may use a persistence model and/or a time-series model. The training model 206 may train and validate the model(s), which may be selected for respective transformer clusters (e.g., as further described with respect to FIG. 4). The model selected from the training model 206 may be used to generate a feature forecast 208 for transformer gases. The error 210 of the feature forecast 208 (e.g., based on a comparison of the feature forecast 208 to actual gas data over the forecasted time period) may be re-input to the training model 206 for refining the training model 206. The feature forecast 208 may be used to generate a feature ROC estimation 212 (e.g., an estimate of the ROC of gas concentration). Based on the actual ROC 214 over the forecasted time period, an estimation error 216 may be determined (e.g., the difference between the feature ROC estimation 212 and the actual ROC 214), which may be used to refine the feature ROC estimation 212. The feature forecast 208 and the feature ROC estimation 212 may be used to determine a time to maintenance 218 for a respective transformer based on when the ROC of a gas is estimated to exceed an alarm threshold.

Figure 3:
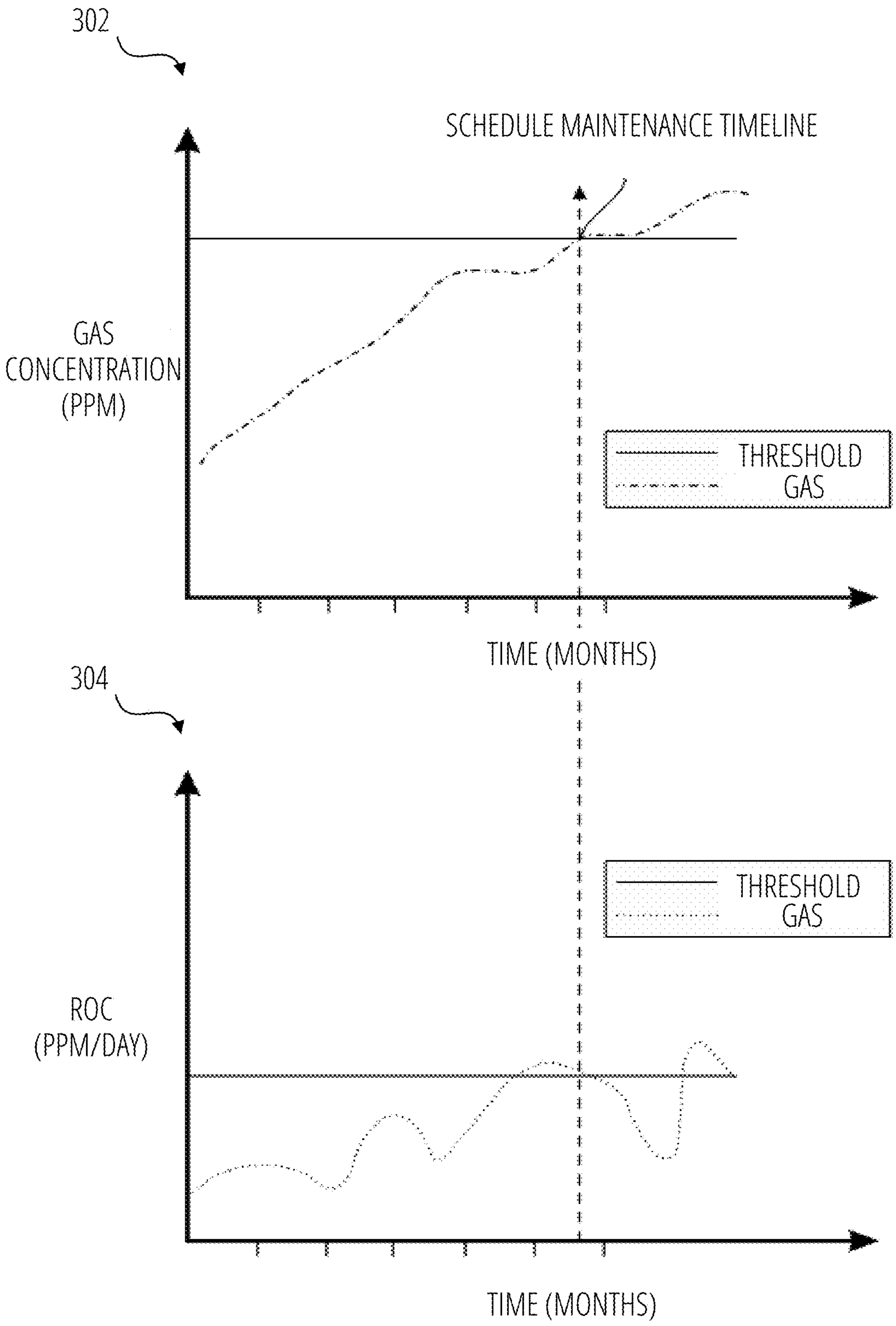
FIG. 3 illustrates example plots of dissolved gases concentration and their rate of change over time for identifying a time to schedule transformer maintenance in accordance with one embodiment.

FIG. 3 illustrates example plots of dissolved gases concentration and their rate of change over time for identifying a time to schedule transformer maintenance in accordance with one embodiment.

Referring to FIG. 3, a plot 302 shows gas concentration (ppm) over time (months), and when the gas concentration is projected to exceed a gas concentration threshold. A plot 304 shows a gas concentration ROC (ppm/day) over time (months), and when the gas concentration ROC is to exceed a gas concentration ROC threshold. Using the plot 302 and/or the plot 304, the time to maintenance 218 may be determined and/or a transformer fault may be forecasted.

Figure 4:
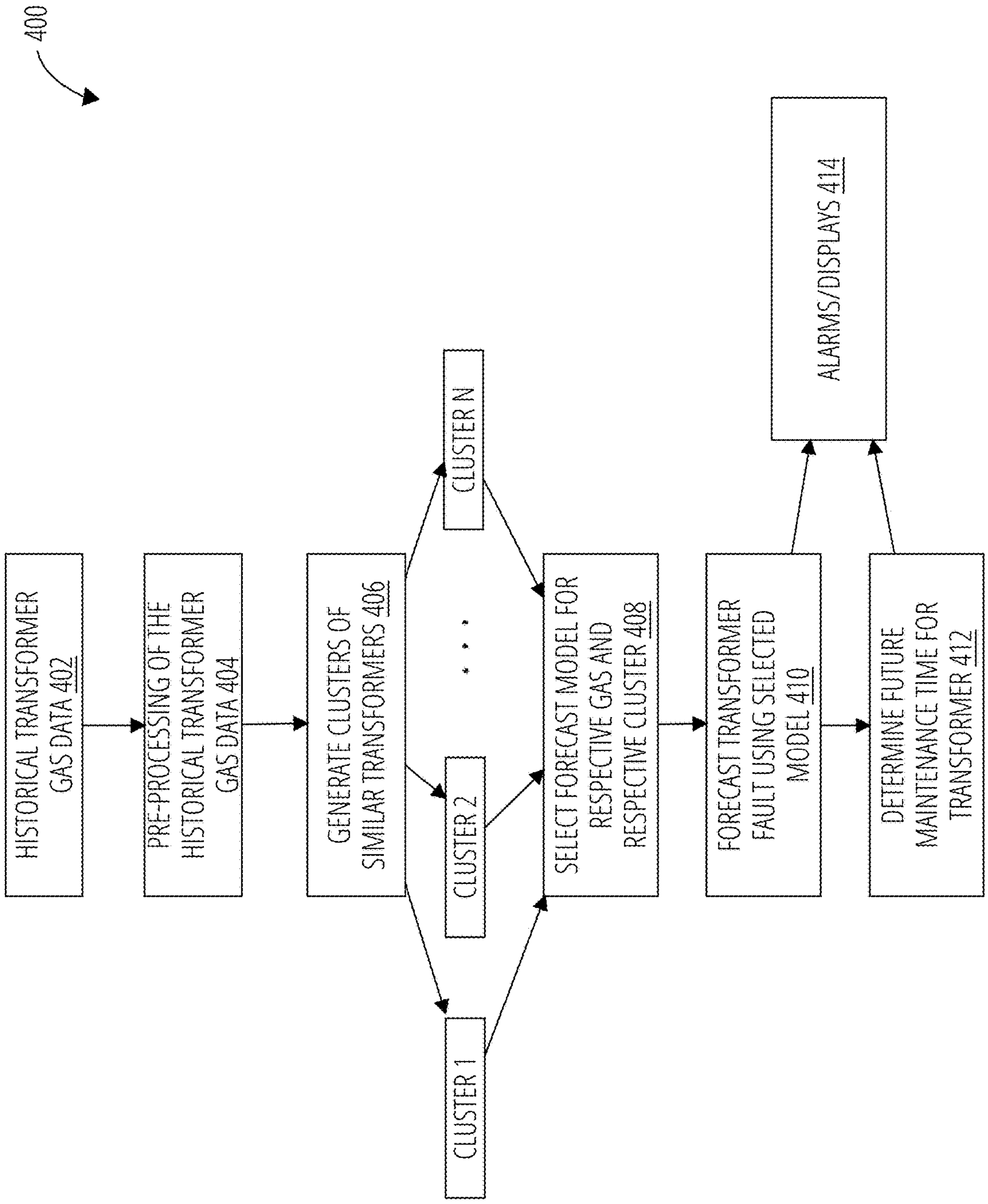
FIG. 4 illustrates an example transformer process using transformer fault forecasting based on dissolved gases concentration and their rate of change in accordance with one embodiment of the present disclosure.

FIG. 4 illustrates an example transformer process 400 using transformer fault forecasting based on dissolved gases concentrations and their rate of change in accordance with one embodiment of the present disclosure.

Referring to FIG. 4, the process 400 may include inputting historical transformer gas data 402 for pre-processing of the historical transformer gas data 404 (e.g., as described at data preprocessing 204 of FIG. 2). A system may generate clusters of similar transformers 406 (e.g., cluster 1, cluster 2, . . . , cluster N). To generate the transformer clusters the system performing the process 400 (e.g., the diagnostic modules 112 of FIG. 1) may input transformer configuration data (e.g., nameplate information), daily load profiles of transformers, and oil characteristics. The system may identify groups of transformers exhibiting similar behavior to test models at scale and provide a more accurate proxy for production performance. In particular, any cluster may train, validate, and select a forecast model for a respective gas at step 408. The models (e.g., from the training model 206 of FIG. 2) may include statistical models, deep learning models, and/or the like. RMSE may be used for evaluating the performance of the models for a gas for a cluster, and the model with the lowest RMSE for the gas for a cluster may be selected as the best performing model to use in the gas forecasting.

Still referring to FIG. 4, the selected model may be used to forecast transformer fault at step 410. The selected model may forecast the gas concentration which can be used to forecast ROC of the respective gas over time, and determine the forecasted gas ROC will exceed an alarm threshold. The system also may determine future maintenance time for a transformer 412. The system may use alarms/displays 414 to communicate when a transformer fault may occur and/or when a transformer should be serviced to prevent a transformer fault based on when a gas ROC is projected by a selected model to exceed an alarm threshold.

Figure 5:
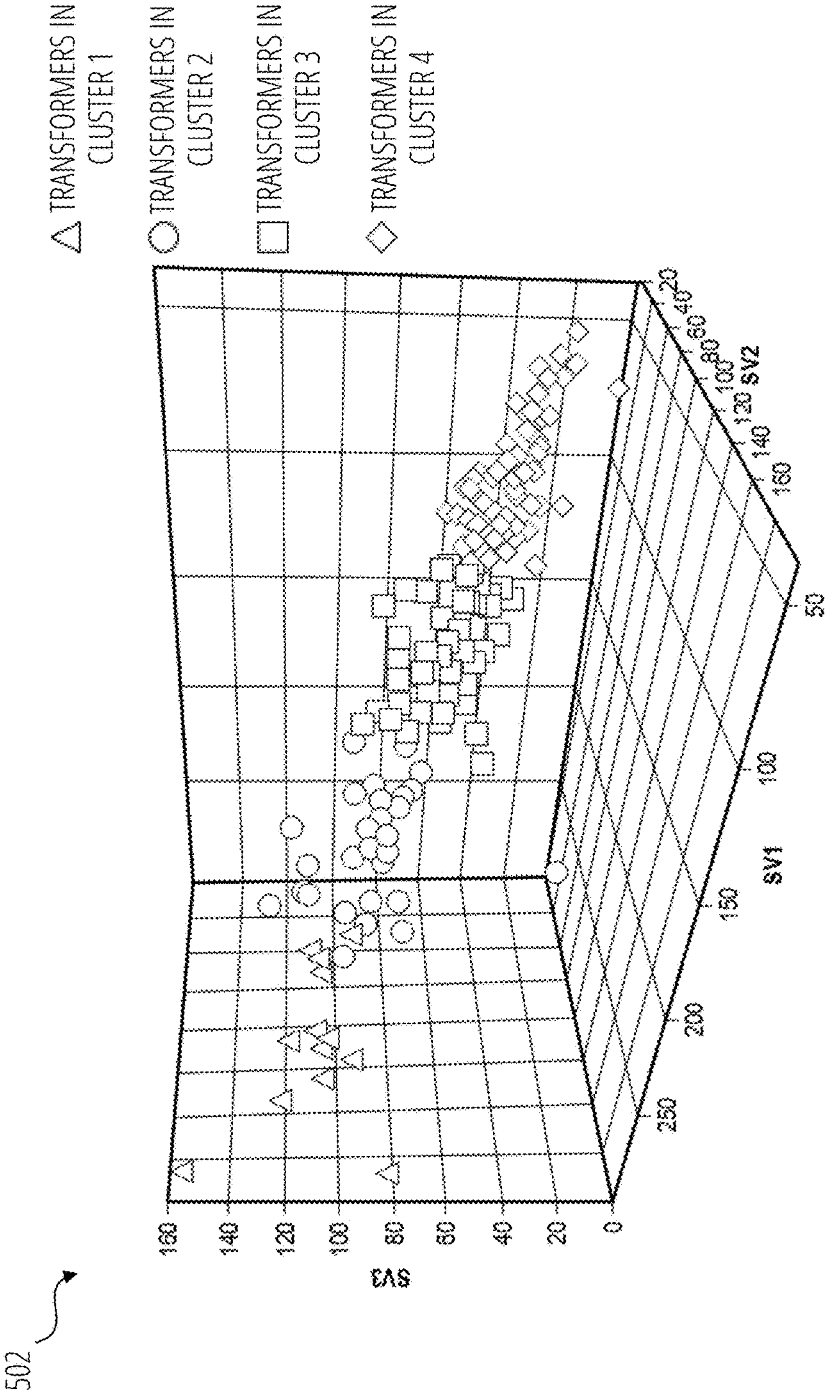
FIG. 5 illustrates an example plot of transformers used in the transformer clustering of the process of FIG. 4 in accordance with one embodiment.

FIG. 5 illustrates an example plot 502 of transformers used in the transformer clustering of the process of FIG. 4 in accordance with one embodiment.

Referring to FIG. 5, the plot 502 shows transformers represented by triangles, circles, squares, and diamonds in a multi-dimensional space representing transformer features evaluated in the transformer clustering of step 408. The different shapes in the plot 502 represent similar transformers, with the diamonds representing the most well-defined cluster of transformers. The most well-defined cluster may be used as training data from the models for the clusters so that the clusters may select the best model for a given gas.

Figure 6:
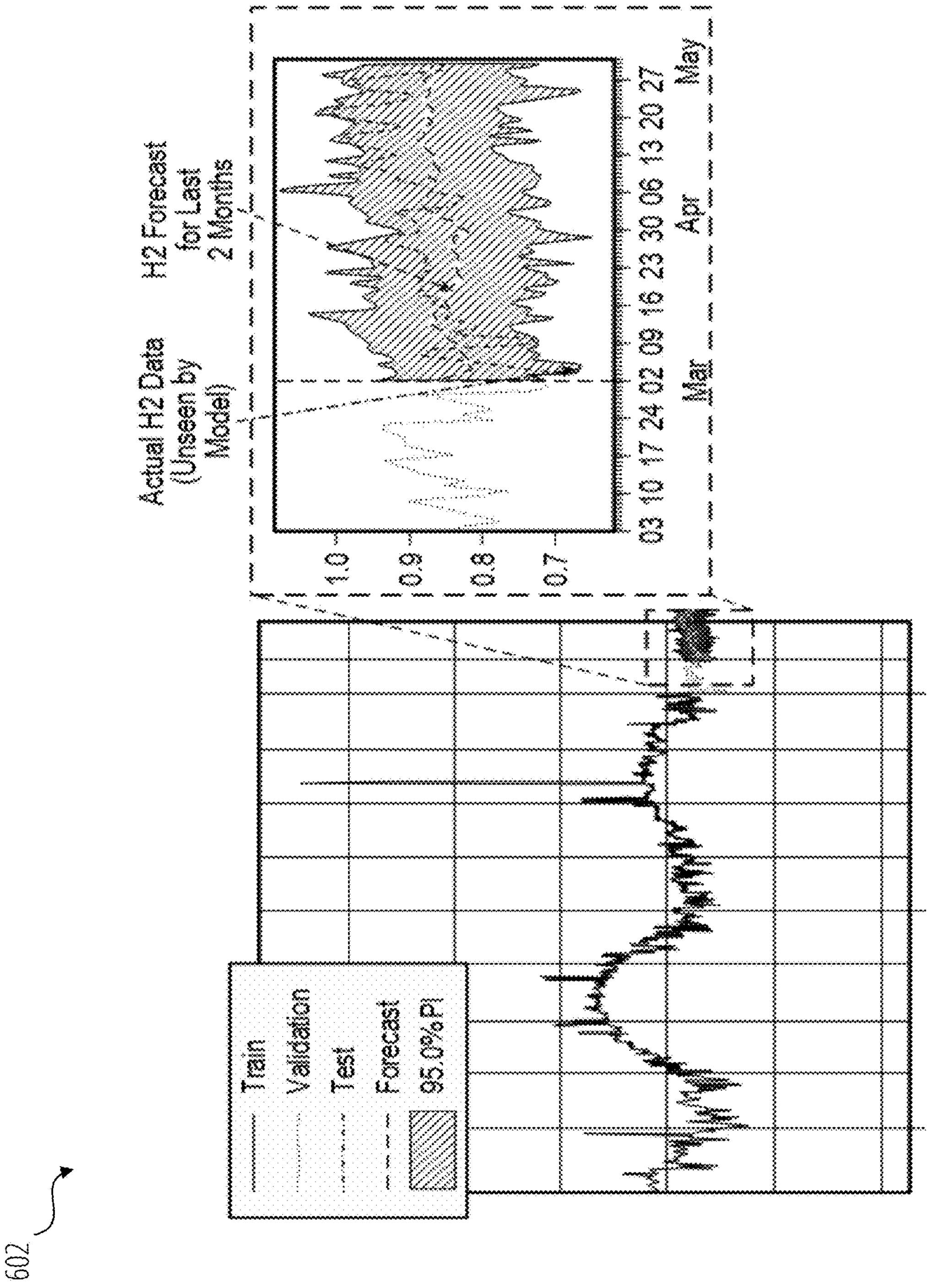
FIG. 6 illustrates example transformer dissolved gases forecasting based on the process of FIG. 4 in accordance with one embodiment.

FIG. 6 illustrates example transformer gas forecasting based on the process of FIG. 4 in accordance with one embodiment.

Referring to FIG. 6, the transformer gas forecasting shown is a hydrogen gas forecast 602. The hydrogen gas forecast 602 may represent an example of the testing and selection of a model at step 408 of FIG. 4, and similar forecasting may be performed by any cluster for any of multiple gases analyzed by a given cluster. The hydrogen gas forecast 602 shows actual hydrogen gas data (e.g., unseen by a model) and the hydrogen forecast from the forecasting at step 410. RMSE may be used to determine the difference between the forecasted hydrogen ROC and the actual ROC for multiple different models. The testing and validation of the models may use multiple iterations so that the model with the highest number of best performances (e.g., the most times having the lowest RMSE) of the tested models may be selected as the optimal model at step 408. Some test results have shown that deep learning models may perform the best for some gases when over a thousand different models are trained and evaluated.

Figure 7:
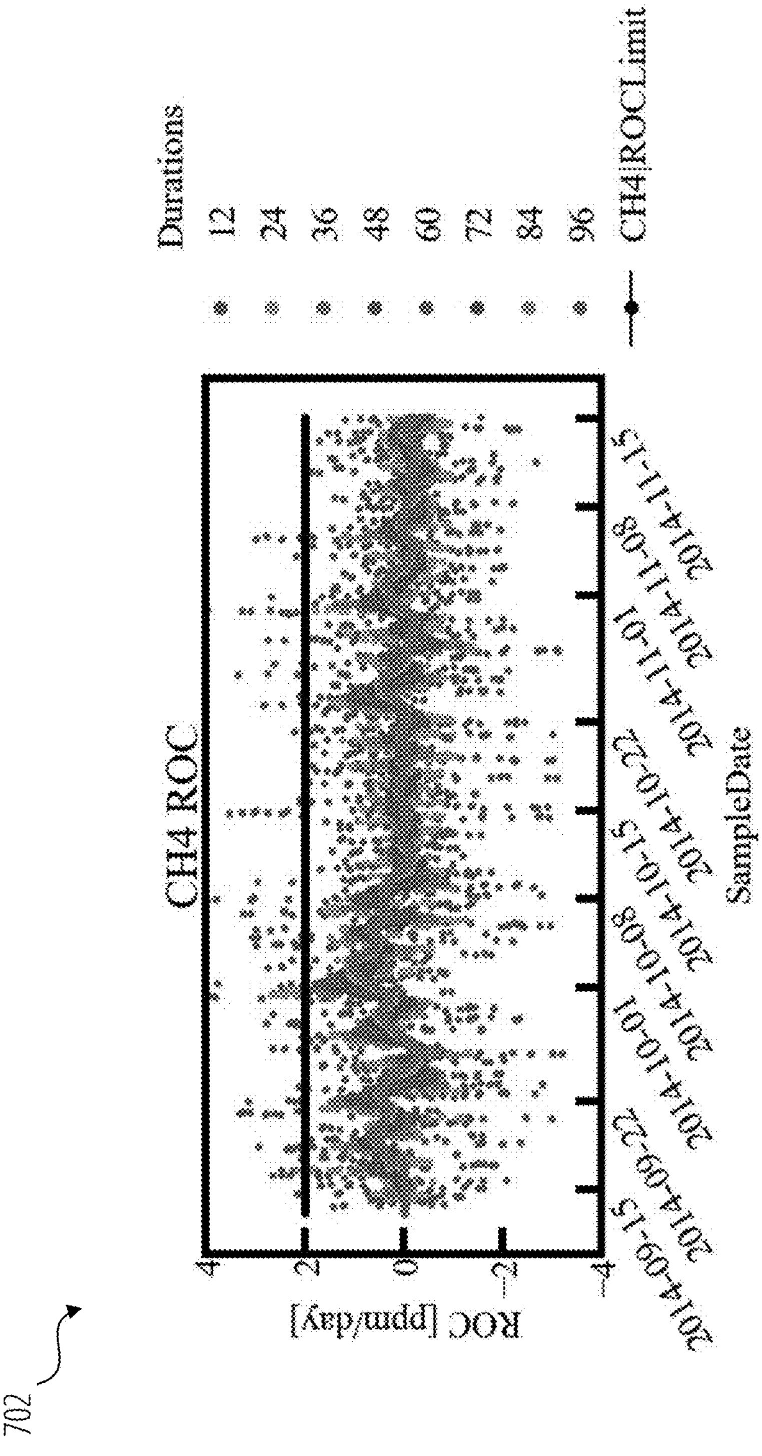
FIG. 7 illustrates an example plot of rate of change in methane gas concentration estimated based on different time windows for use in the process of FIG. 4 in accordance with one embodiment.

FIG. 7 illustrates an example plot 702 of rate of change in methane gas concentration estimated based on different time windows for use in the process 400 of FIG. 4 in accordance with one embodiment.

Referring to FIG. 7, the plot 702 shows a methane ROC for different ROC time windows (e.g., durations of 12 hours, 24 hours, 36 hours, 48 hours, 60 hours, 72 hours, 84 hours, and 96 hours). As shown, there are more alarms (e.g., the ROC exceeding an alarm threshold) when the ROC time window is smaller. A larger ROC time window may produce less ROC variation. The number of data points n in the ROC calculation represented by $$\beta = ROC = \frac{n\left(\sum_i t_i \rho_i\right) - \left(\sum_i t_i\right)\left(\sum_i \rho_i\right)}{n\left(\sum_i t_i \cdot t_i\right) - \left(\sum_i t_i\right)^2}$$

may be less than or equal to 96 hours as shown, where alpha may be represented by $$\alpha = \frac{\left(\sum_i \rho_i\right) - \beta\left(\sum_i t_i\right)}{n}.$$

In one or more embodiments, the system (e.g., the diagnostic modules 112) may identify a sample interval, start with a window size of 10× the sample interval, identify a 3-sigma spread for the window size, and repeat the process until 3-sigma varies within 0.1 to select the ROC time window. The ROC time window size may one that has more than 20 samples (e.g., to minimize volatility such as shown in the plot 702).

Figure 8:
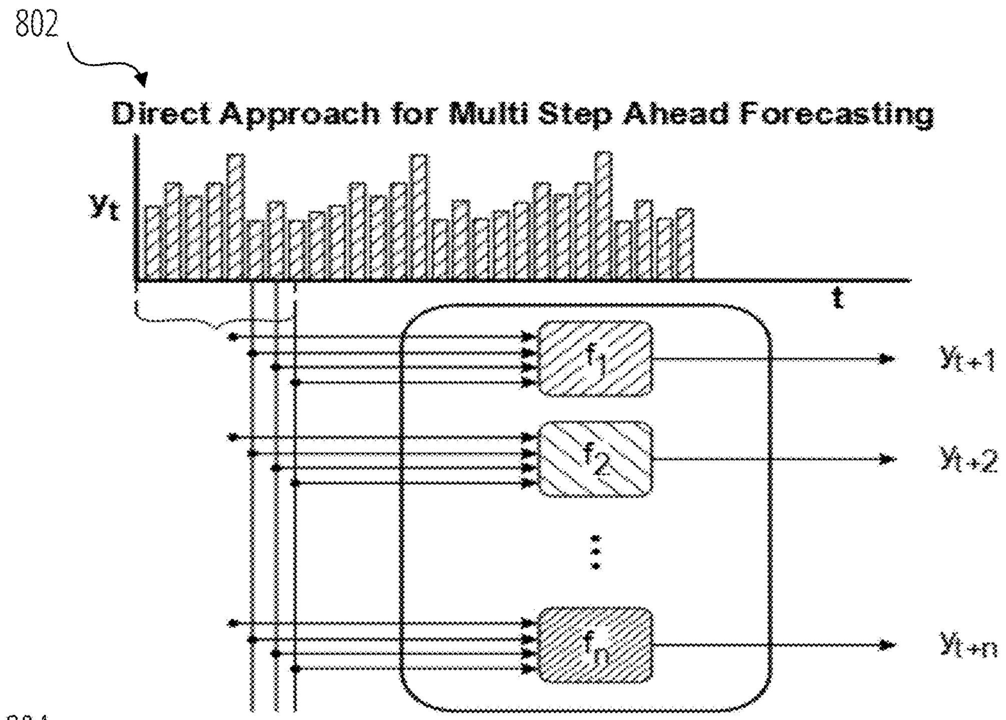
FIG. 8 illustrates an example direct approach for transformer gas forecasting and an example recursive approach for transformer gas forecasting in accordance with one embodiment.
Figure 8:
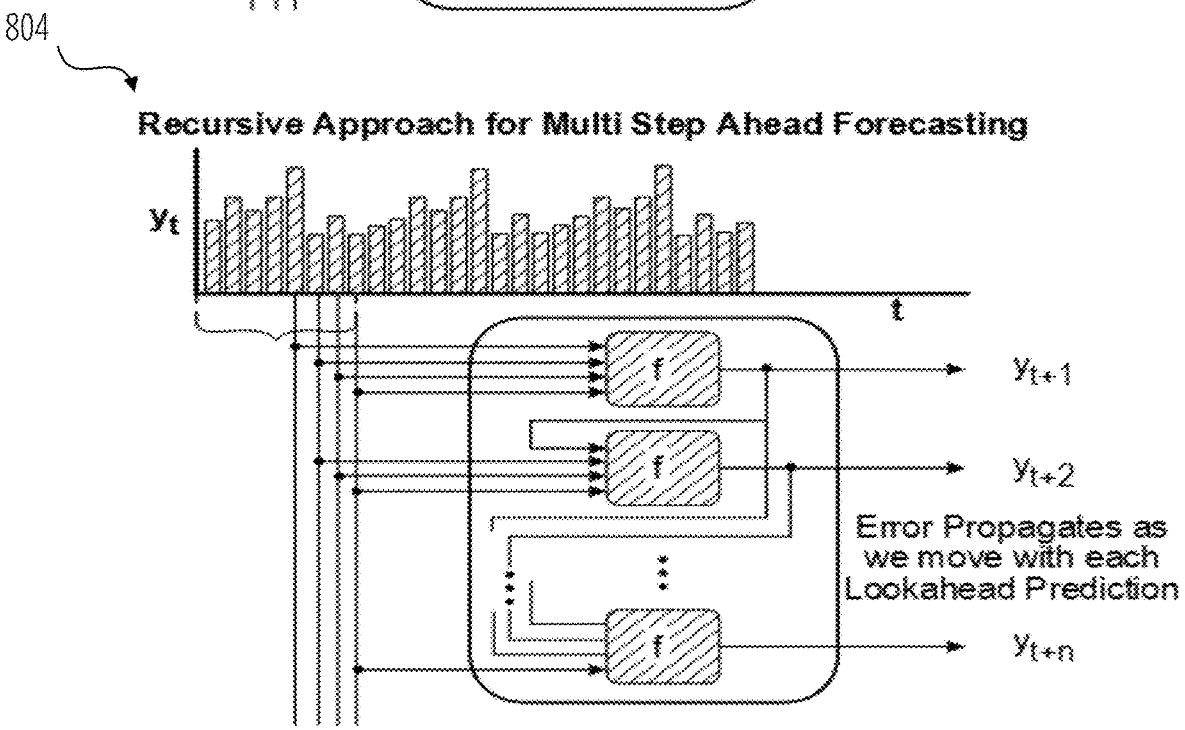

FIG. 8 illustrates an example direct approach for transformer gas forecasting and an example recursive approach for transformer gas forecasting in accordance with one embodiment.

In a direct approach 802, the predicted gas concentration may not be dependent on a previous prediction (e.g., $y_{t+n}$ may not depend on $y_t$+2, which may not depend on $y_{t+1}$, etc.). In a recursive approach 804, the predicted gas concentration for a time interval may depend on a prediction for another time interval (e.g., $y_{t+2}$ may depend on $y_{t+1}$, $y_{t+n}$ may depend on $y_{t+2}$, etc.). The time-series forecasting of FIG. 8 may represent the 208 of FIG. 2, for example.

Figure 9:
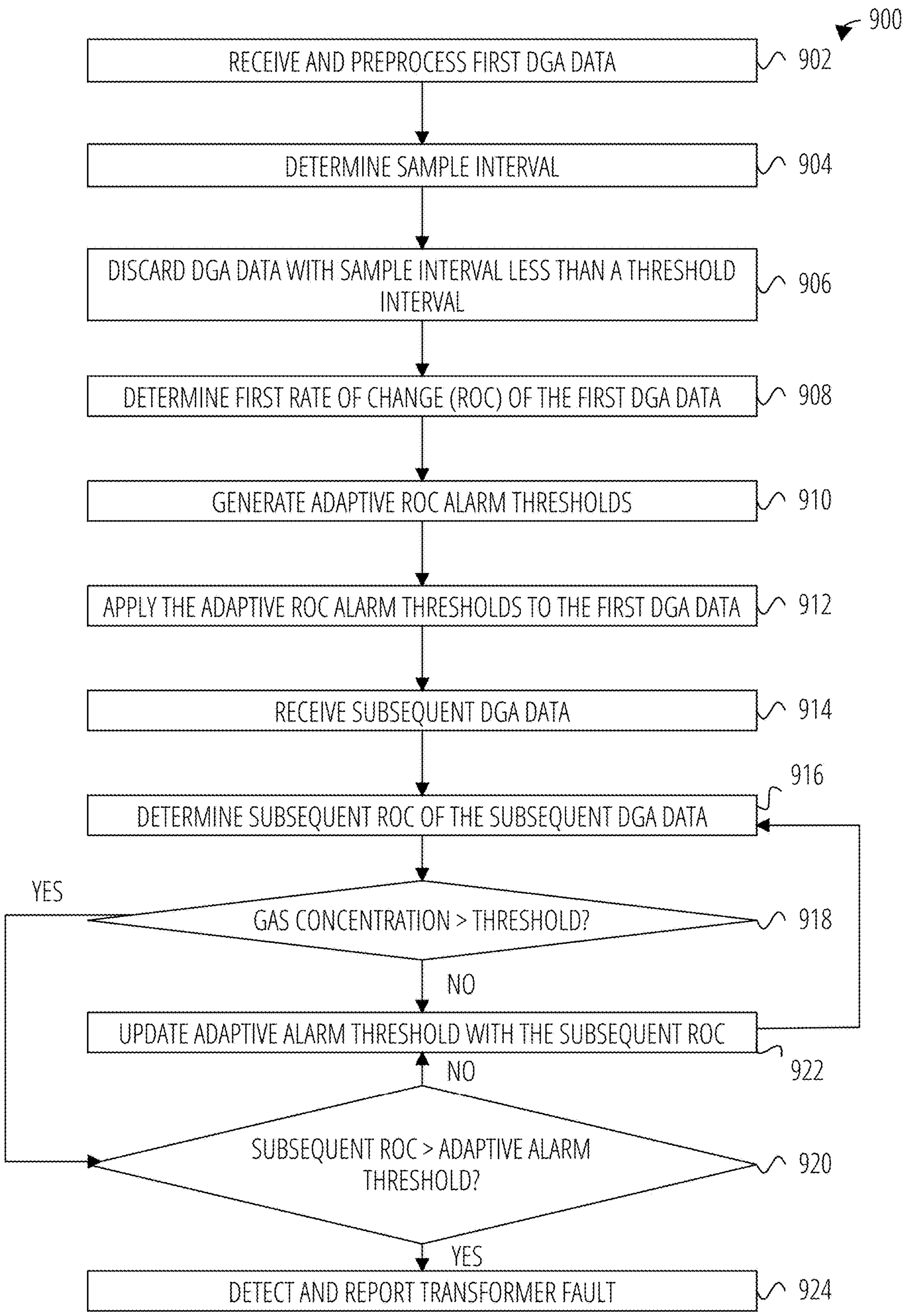
FIG. 9 illustrates an example process for using dissolved gas analysis with adaptive alarm thresholds for rate of change in dissolved gases concentration in accordance with one embodiment of the present disclosure.

FIG. 9 illustrates an example process 900 for using dissolved gas analysis with adaptive alarm thresholds for rate of change in dissolved gas concentration in accordance with one embodiment of the present disclosure.

Referring to FIG. 9, a device (or system, e.g., using the diagnostic modules 112 of FIG. 1) may, at block 902, receive first DGA data from a transformer (e.g., the transformer 104 of FIG. 1), and at block 904, may select a sample time. For example, transformer gases may be sampled periodically, that is at a specific time interval which could be every hour or every four hour or every day etc. At block 906, the device may sort the DGA data by sample time and discard DGA data with a sample interval less than a threshold sample interval (e.g., 50 minutes or some other time). At block 908, the device may determine a first ROC of the remaining first DGA data. The ROC may use the equation $\rho=\beta\times t+\alpha$, Where p=concentration (ppm) of target measurement, $\beta$=ROC formula, t=time (hours) from initial zero start time, $\alpha$=vertical axis. Beta may be represented by $$\beta = ROC = \frac{n\left(\sum_i t_i\rho_i\right) - \left(\sum_i t_i\right)\left(\sum_i \rho_i\right)}{n\left(\sum_i t_i \cdot t_i\right) - \left(\sum_i t_i\right)^2}$$

and alpha may be represented by $$\alpha = \frac{\left(\sum_i \rho_i\right) - \beta\left(\sum_i t_i\right)}{n},$$

where n=number of data points, and it is determined by time window of the gas concentrations to calculate the ROC.

Still referring to FIG. 2, at block 910, the device may generate adaptive alarm thresholds for ROC, for example, using any of the techniques in Table 2. At block 912, the device may apply the adaptive ROC alarm thresholds to the first DGA data (e.g., compare the DGA data for respective ROC in dissolved gases to respective ROC alarm thresholds) to determine whether any ROC of those gases exceeds an alarm threshold. At block 914, the device may receive subsequent DGA data for the transformer. Based on the subsequent DGA data, at block 916, the device may generate a subsequent ROC from the gas concentration in the subsequent DGA data. When a respective gas concentration is greater than a concentration threshold at block 918 (e.g., a standard-based threshold), the device may, at block 920, verify the transformer fault (e.g., as indicated by the gas concentration level exceeding the threshold) by determining whether the subsequent ROC of the gas is greater than its adaptive alarm threshold. When the respective gas concentration at block 920 is less than or equal to the standard threshold, the device may update the adaptive alarm threshold for that gas using the subsequent ROC calculated at block 916. When both subsequent gas concentration and their ROC are greater than their alarm thresholds at block 918 and 920, the device may detect a fault and report it (e.g., via the display/alarm 114 of FIG. 1).

Figure 10A:
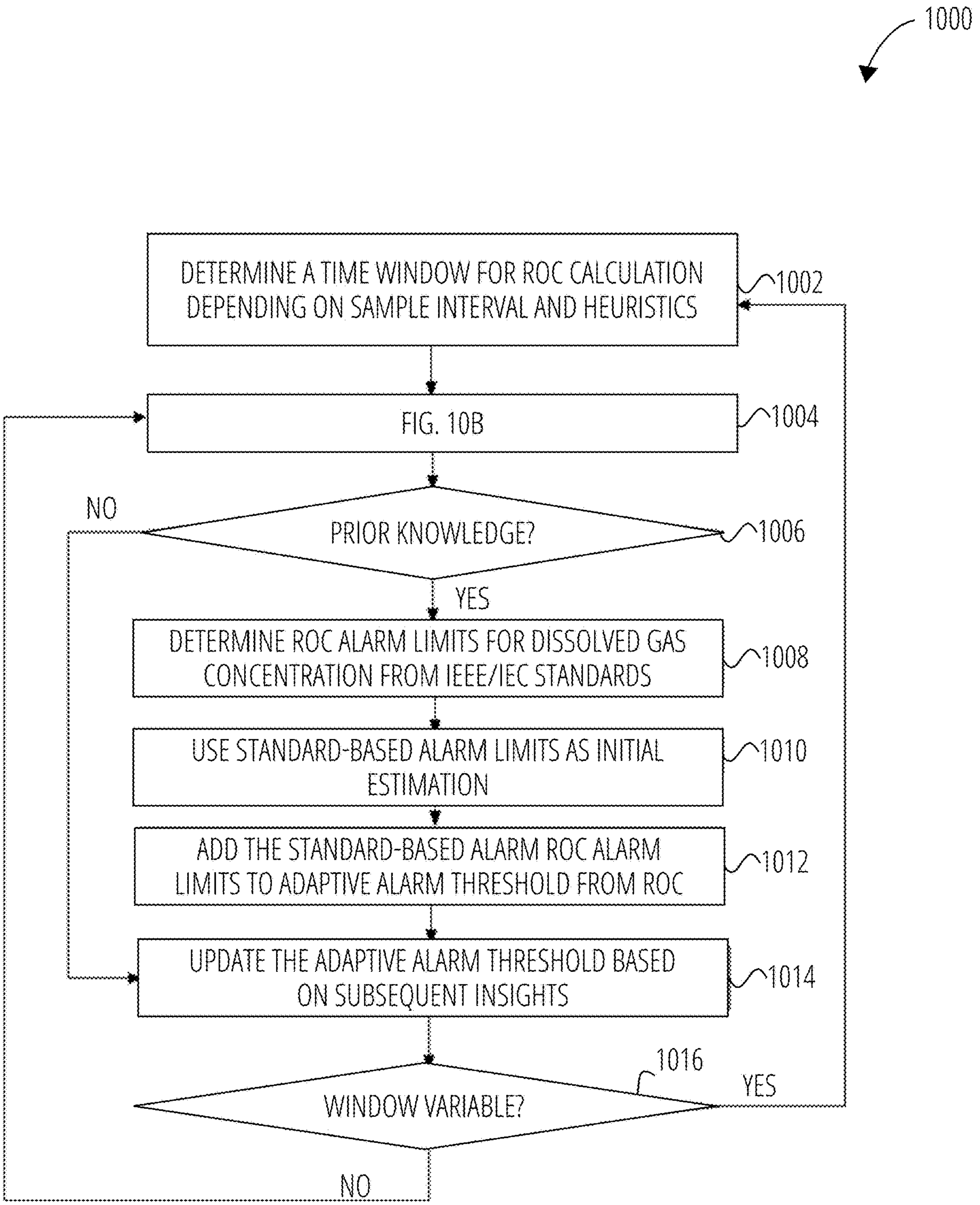
FIG. 10A illustrates an example process for computing adaptive alarm thresholds for rate of change in dissolved gases concentration in accordance with one embodiment of the present disclosure.

FIG. 10A illustrates an example process 1000 for using dissolved gas analysis with adaptive alarm thresholds for rate of change in dissolved gas concentration in accordance with one embodiment of the present disclosure.

At block 1002, a device (or system, e.g., using the diagnostic modules 112 of FIG. 1) may determine a time window to use for ROC calculation, depending on a sample interval and heuristics. The minimum number of samples may depend on the number of samples in a window. For example, to reduce variability, the ROC time window may be set to half of the number of samples in a window. It may be desirable to set a window size with 20 or more samples.

Figure 10B:
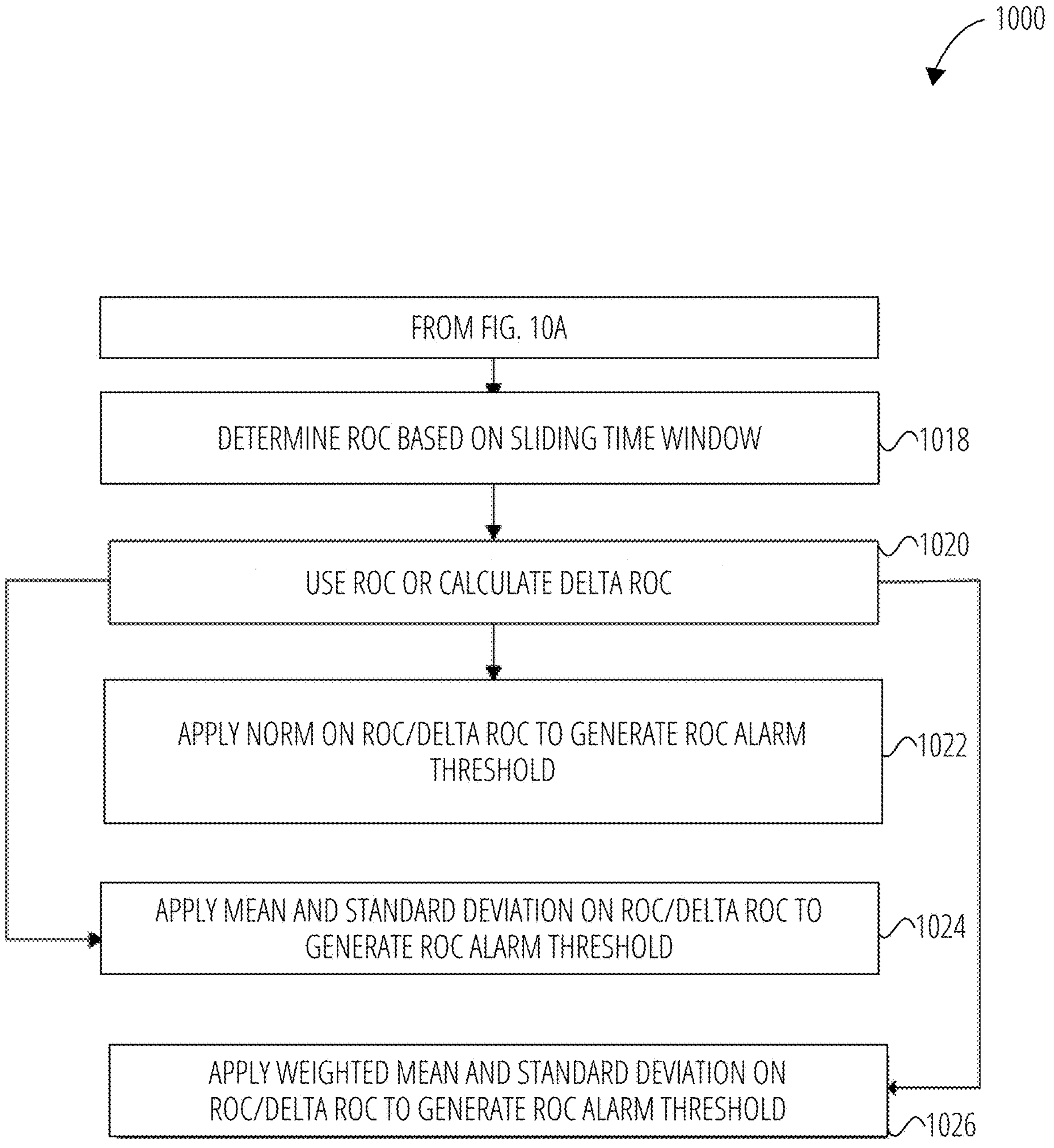
FIG. 10B illustrates the example methodologies of FIG. 10A for computing adaptive alarm thresholds for rate of change in dissolved gases concentration based on a variable window in accordance with one embodiment of the present disclosure.

At block 1004, the process 1000 may continue at FIG. 10B.

At block 1006, when there is prior knowledge of the standard-based alarm thresholds, the process 1000 may continue at block 1008. At block 1008, the device may determine ROC alarm limits for dissolved gas concentration from the IEEE/IEC standards.

At block 1010, the device may apply the standard-based alarm thresholds as an initial estimation, and at block 1012, the device may add the standard-based alarm thresholds to an adaptive alarm threshold from the ROC. At block 1014, the device may update the adaptive alarm threshold based on subsequent insights from received DGA data. At block 1016, when the window is variable, the process 1000 may return to block 1002. When the window is fixed, the process 1000 may return to block 1004.

FIG. 10B illustrates the example process 1000 of FIG. 10A for using dissolved gas analysis with adaptive alarm thresholds for rate of change in dissolved gas concentration based on a sliding time window that could be fixed or variable in accordance with one embodiment of the present disclosure.

At block 1018, the device may determine the gas concentration ROC based on a sliding time window. At block 1020, the device may use the gas concentration ROC or may calculate a delta ROC.

At block 1022, the device may apply the norm on the ROC or delta ROC to generate the ROC alarm threshold.

Alternatively, at block 1024, the device may apply a mean and standard deviation on the ROC or delta ROC to generate the ROC alarm threshold.

Alternatively, at block 1026, the device may apply weighted mean and standard deviation on the ROC or delta ROC to generate the ROC alarm threshold.

Figure 11:
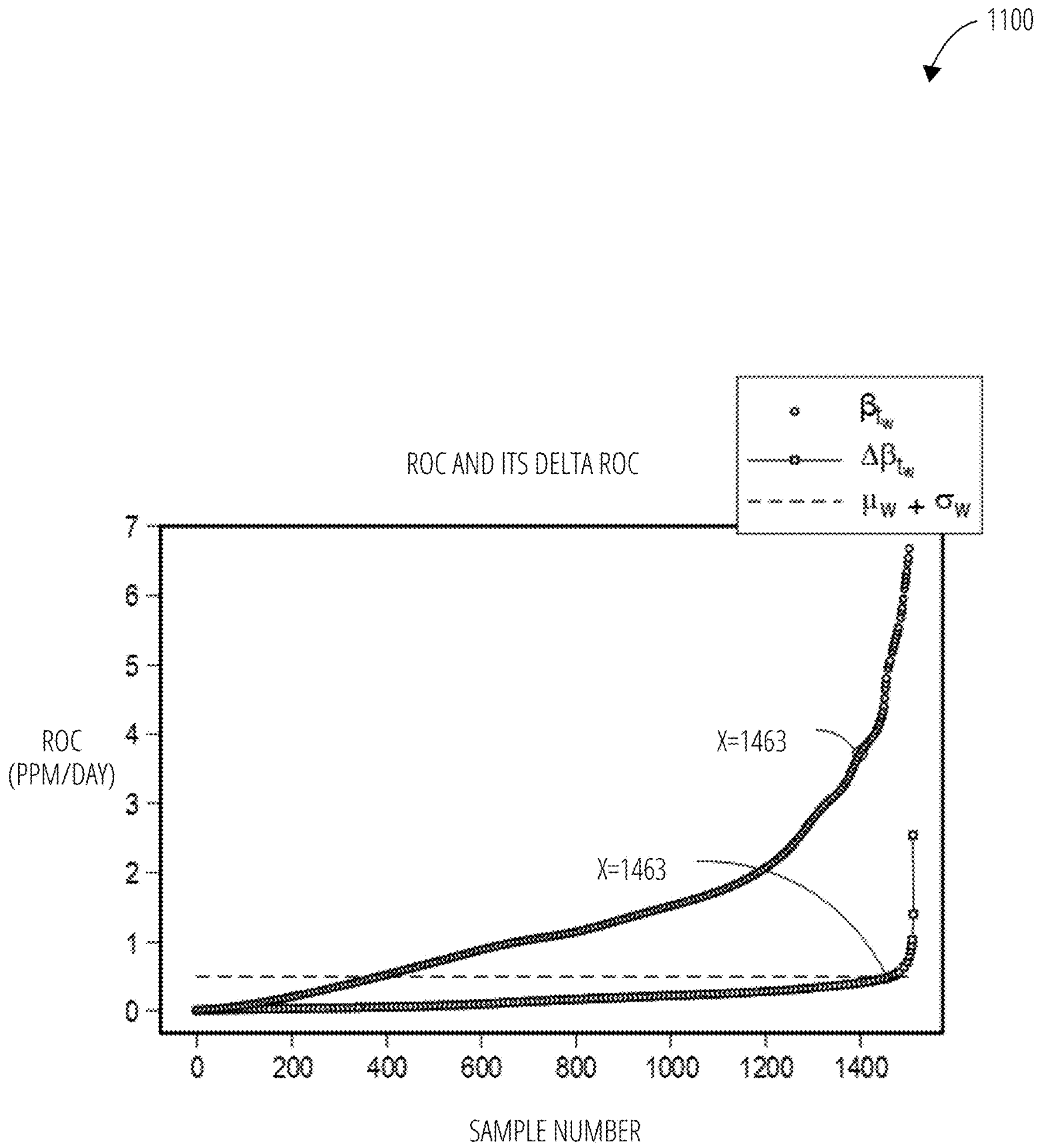
FIG. 11 illustrates an example graph showing rate of change and delta rate of change of a dissolved gas concentration used in dissolved gas analysis with adaptive alarm thresholds for rate of change in dissolved gas concentration in accordance with one embodiment of the present disclosure.

FIG. 11 illustrates an example graph 1100 showing rate of change and delta rate of change of transformer gas used in dissolved gas analysis with adaptive alarm thresholds for rate of change in dissolved gas concentration in accordance with one embodiment of the present disclosure.

The graph 1100 of FIG. 11 shows the methodology to calculate adaptive alarm threshold based on $\Delta\beta_{t_{wDeltaROC}}$. The ROC represented by $\beta_{t_w}$ for the time window $t_w$, and the delta ROC represented by $\Delta\beta_{t_w}$ for the time window $t_w$ per DGA sample size on the horizontal axis. The near zero slope region of DeltaROC represents the normal data, while the right-most region represents sudden change in gas concentration indicating a possible fault scenario. As shown by the graph 1100, the weighted mean and standard deviation cuts the deltaROC plot at x=1463 which is the change point between near-zero and near-pi/2 slope of deltaROC. The ROC value at x=1463 represents the adaptive alarm threshold. The graph may present the change point based on the statistical methods in Table 2, here in the limit is based on the weighted mean and standard deviation of delta ROC represented by $\mu_w+\vartheta_w$, per DGA sample size on the horizontal axis. The ROC value, $\beta(1463)$ represents the adaptive threshold and $\beta\geq\beta(1463)$ indicates the abnormal ROC in dissolved gas concentration. In this manner, the adaptive alarm threshold may be based on DeltaROC.

Figure 12:
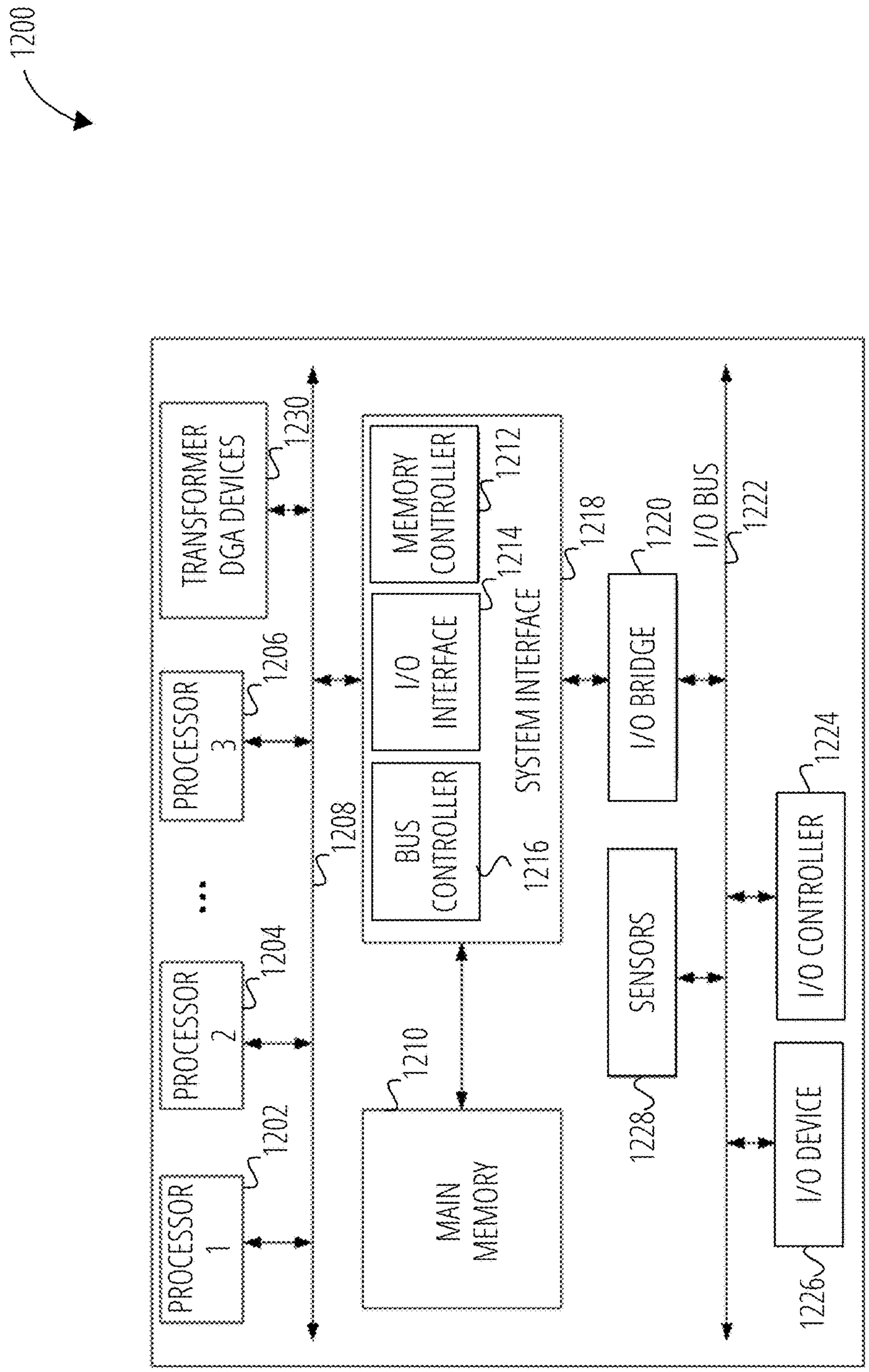
FIG. 12 is a diagram illustrating an example machine that may be used in implementing embodiments of the present disclosure.

FIG. 12 is a diagram illustrating an example machine 1200 that may be used in implementing embodiments of the present disclosure. For example, the machine 1200 of FIG. 12 may represent at least a portion of the system 100 shown in FIG. 1, as discussed above. The machine 1200 includes one or more processors 1202-1206. Processors 1202-1206 may include one or more internal levels of cache (not shown) and a bus controller 1216 or bus interface unit to direct interaction with the processor bus 1208. Processor bus 1208, also known as the host bus or the front side bus, may be used to couple the processors 1202-1206 with the system interface 1218. System interface 1218 may be connected to the processor bus 1208 to interface other components of the machine 1200 with the processor bus 1208. For example, system interface 1218 may include a memory controller 1212 for interfacing a main memory 1210 with the processor bus 1208. The main memory 1210 typically includes one or more memory cards and a control circuit (not shown). System interface 1218 may also include an input/output (I/O) I/O interface 1214 to interface one or more I/O bridges I/O bridge 1220 or I/O devices with the processor bus 1208. One or more I/O controllers and/or I/O devices may be connected with the I/O bus 1222, such as I/O controller 1224 and I/O device 1226, as illustrated.

I/O device 1226 may also include an input device (not shown), such as an alphanumeric input device, including alphanumeric and other keys for communicating information and/or command selections to the processors 1202-1206. Another type of user input device includes cursor control, such as a mouse, a trackball, or cursor direction keys for communicating direction information and command selections to the processors 1202-1206 and for controlling cursor movement on the display device.

Machine 1200 may include an adaptive storage device, referred to as main memory 1210, or a random access memory (RAM) or other computer-readable devices coupled to the processor bus 1208 for storing information and instructions to be executed by the processors 1202-1206. Main memory 1210 also may be used for storing temporary variables or other intermediate information during execution of instructions by the processors 1202-1206. Machine 1200 may include a read only memory (ROM) and/or other static storage device coupled to the processor bus 1208 for storing static information and instructions for the processors 1202-1206. The system outlined in FIG. 12 is but one possible example of a computer system that may employ or be configured in accordance with aspects of the present disclosure.

According to one embodiment, the above techniques may be performed by machine 1200 in response to processor 1204 executing one or more sequences of one or more instructions contained in main memory 1210. These instructions may be read into main memory 1210 from another machine-readable medium, such as a storage device. Execution of the sequences of instructions contained in main memory 1210 may cause processors 1202-1206 to perform the process steps described herein. In alternative embodiments, circuitry may be used in place of or in combination with the software instructions. Thus, embodiments of the present disclosure may include both hardware and software components.

A machine readable medium includes any mechanism for storing or transmitting information in a form (e.g., software, processing application) readable by a machine (e.g., a computer). Such media may take the form of, but is not limited to, non-volatile media and volatile media and may include removable data storage media, non-removable data storage media, and/or external storage devices made available via a wired or wireless network architecture with such computer program products, including one or more database management products, web server products, application server products, and/or other additional software components. Examples of removable data storage media include Compact Disc Read-Only Memory (CD-ROM), Digital Versatile Disc Read-Only Memory (DVD-ROM), magneto-optical disks, flash drives, and the like. Examples of non-removable data storage media include internal magnetic hard disks, SSDs, and the like. The one or more memory devices may include volatile memory (e.g., adaptive random access memory (DRAM), static random access memory (SRAM), etc.) and/or non-volatile memory (e.g., read-only memory (ROM), flash memory, etc.).

Computer program products containing mechanisms to effectuate the systems and methods in accordance with the presently described technology may reside in main memory 1210, which may be referred to as machine-readable media. It will be appreciated that machine-readable media may include any tangible non-transitory medium that is capable of storing or encoding instructions to perform any one or more of the operations of the present disclosure for execution by a machine or that is capable of storing or encoding data structures and/or modules utilized by or associated with such instructions. Machine-readable media may include a single medium or multiple media (e.g., a centralized or distributed database, and/or associated caches and servers) that store the one or more executable instructions or data structures.

Embodiments of the present disclosure include various steps, which are described in this specification. The steps may be performed by hardware components or may be embodied in machine-executable instructions, which may be used to cause a general-purpose or special-purpose processor programmed with the instructions to perform the steps. Alternatively, the steps may be performed by a combination of hardware, software and/or firmware.

Various modifications and additions can be made to the exemplary embodiments discussed without departing from the scope of the present invention. For example, while the embodiments described above refer to particular features, the scope of this invention also includes embodiments having different combinations of features and embodiments that do not include all of the described features. Accordingly, the scope of the present invention is intended to embrace all such alternatives, modifications, and variations together with all equivalents thereof.

What is claimed is:

1. A method for using forecasting power transformer faults, the method comprising:

receiving, by at least one processor of a device, dissolved gas data of power transformers;

receiving, by the at least one processor, features of the power transformers;

generating, by the at least one processor, based on the features and the dissolved gas data, clusters of transformers, wherein each respective cluster of the clusters comprises transformers exhibiting similarities to each other;

selecting, by the at least one processor, for each respective cluster and for each respective gas of the dissolved gas data, from among multiple machine learning models trained to minimize a difference between a forecast gas concentration and an actual gas concentration, a machine learning model associated with forecasting concentration of the respective gas of the respective cluster;

generating, by the at least one processor, using a selected machine learning model, a forecasted gas concentration of the respective gas of the respective cluster;

estimating, by the at least one processor, using the forecasted gas concentration, a rate of change (ROC) of the respective gas of the respective cluster;

predicting, by the at least one processor, based on comparisons of the forecasted gas concentration and the ROC to respective alarm thresholds, a future fault of a transformer; and generating, by the at least one processor, an alert indicating that transformer maintenance is required prior to the predicted future fault.

2. The method of claim 1, wherein an alarm threshold for the ROC is an adaptive alarm threshold.

3. The method of claim 1, wherein the features of the power transformers comprise transformer operation, oil condition, transformer state, and dissolved gas concentration history.

4. The method of claim 3, wherein generating the clusters is based on a principal components analysis and k-means clustering technique that is based on the features.

5. The method of claim 1, wherein the multiple machine learning models comprise a persistence model and a time-series model.

6. The method of claim 1, wherein the multiple machine learning models comprise a deep learning model.

7. The method of claim 1, wherein selecting the machine learning model comprises determining that a gas concentration forecast of the selected machine learning model has a lowest root mean squared error of the gas concentration forecasts of the multiple machine learning models for the respective gas for the respective cluster.

8. The method of claim 1, wherein generating the forecasted ROC of the respective gas of the respective cluster comprises selecting a ROC time window greater than 48 hours and less than 96 hours based on a standard deviation of forecasted ROC values using the ROC time window.

9. The method of claim 1, further comprising:

identifying a newly added transformer to an electrical grid, the newly added transformer not yet included in the clusters; and adding the newly added transformer to one of the clusters based on similarities between the newly added transformer and the one of the clusters.

10. The method of claim 1, further comprising determining, based on the comparisons of the forecasted gas concentration and the ROC to the respective alarm thresholds, a time when to schedule the transformer maintenance, wherein the alert is further indicative of the time, and wherein the respective alarm thresholds comprise at least one of a static alarm threshold or an adaptive alarm threshold.

11. A device for using forecasting power transformer faults, the device comprising memory coupled to at least one processor, the at least one processor configured to:

receive dissolved gas data of power transformers;

receive features of the power transformers;

generate, based on the features and the dissolved gas data, clusters of transformers, wherein each respective cluster of the clusters comprises transformers exhibiting similarities to each other;

select, for each respective cluster and for each respective gas of the dissolved gas data, from among multiple machine learning models trained to minimize a difference between a forecast gas concentration and an actual gas concentration, a machine learning model associated with forecasting concentration of the respective gas of the respective cluster;

generate, using a selected machine learning model, a forecasted gas concentration of the respective gas of the respective cluster;

estimate, using forecasted gas concentration, a rate of change (ROC) of the respective gas of the respective cluster;

predict, based on comparisons of the forecasted gas concentration and the ROC to respective alarm thresholds, a future fault of a transformer; and generate an alert that transformer maintenance is required prior to the predicted future fault.

12. The device of claim 11, wherein an alarm threshold for the ROC is an adaptive alarm threshold.

13. The device of claim 11, wherein to select the machine learning model comprises to determine that a gas concentration forecast of the selected machine learning model has a lowest root mean squared error of the gas concentration forecasts of the multiple machine learning models for the respective gas for the respective cluster.

14. The device of claim 11, wherein to generate the forecasted ROC of the respective gas of the respective cluster comprises to select a ROC time window greater than 48 hours and less than 96 hours based on a standard deviation of forecasted ROC values using the ROC time window.

15. The device of claim 11, wherein the at least one processor is further configured to:

identify a newly added transformer to a power grid, the newly added transformer not yet included in the clusters; and add the newly added transformer to one of the clusters based on similarities between the newly added transformer and the one of the clusters.

16. The device of claim 11, wherein the at least one processor is further configured to determine, based on the comparison of the forecasted ROC to the ROC alarm threshold, a time when to schedule the transformer maintenance, wherein the alert is further indicative of the time.

17. A system for using forecasting power transformer faults, the system comprising:

a dissolved gas analyzer device; and memory coupled to at least one processor, the at least one processor configured to:

receive, from the dissolved gas analyzer device, dissolved gas data of power transformers;

receive features of the power transformers;

generate, based on the features and the dissolved gas data, clusters of transformers, wherein each respective cluster of the clusters comprises transformers exhibiting similarities to each other;

select, for each respective cluster and for each respective gas of the dissolved gas data, from among multiple machine learning models trained to minimize a difference between a forecast gas concentration and an actual gas concentration, a machine learning model associated with forecasting concentration of the respective gas of the respective cluster;

generate, using a selected machine learning model, a forecasted gas concentration of the respective gas of the respective cluster;

estimate, using the forecasted gas concentration, a rate of change (ROC) of the respective gas of the respective cluster;

predict, based on comparisons of the forecasted gas concentration and the ROC to respective alarm thresholds, a future fault of a transformer; and generate an alert indicating that transformer maintenance is required prior to the predicted future fault of the transformer.

18. The system of claim 17, wherein an alarm threshold for the ROC is an adaptive alarm threshold.

19. The system of claim 17, wherein the at least one processor is further configured to:

identify a newly added transformer to an electrical grid, the newly added transformer not yet included in the clusters; and add the newly added transformer to one of the clusters based on similarities between the newly added transformer and the one of the clusters.

20. The system of claim 17, wherein the at least one processor is further configured to determine, based on the comparisons of the forecasted gas concentration and the ROC to the respective alarm thresholds, a time when to schedule the transformer maintenance, wherein the alert is further indicative of the time.

* * * * *